(12) United States Patent
Zamir et al.

(10) Patent No.: US 10,432,232 B2
(45) Date of Patent: Oct. 1, 2019

(54) MULTI-TYPE PARITY BIT GENERATION FOR ENCODING AND DECODING

(71) Applicant: SanDisk Technologies LLC, Plano, TX (US)

(72) Inventors: Ran Zamir, Ramat Gan (IL); Alexander Bazarsky, Holon (IL); Eran Sharon, Rishon Lezion (IL); Idan Alrod, Herzeliya (IL)

(73) Assignee: SanDisk Technologies LLC, Plano, TX (US)

( * ) Notice: Subject to any disclaimer, the term of this patent is extended or adjusted under 35 U.S.C. 154(b) by 271 days.

(21) Appl. No.: 15/252,753

(22) Filed: Aug. 31, 2016

(65) Prior Publication Data

US 2017/0255512 A1    Sep. 7, 2017

Related U.S. Application Data

(60) Provisional application No. 62/303,899, filed on Mar. 4, 2016.

(51) Int. Cl.
*G06F 11/10* (2006.01)
*H03M 13/35* (2006.01)
(Continued)

(52) U.S. Cl.
CPC ......... *H03M 13/353* (2013.01); *G06F 11/108* (2013.01); *G06F 11/1012* (2013.01); *H03M 13/1102* (2013.01); *H03M 13/1108* (2013.01); *H03M 13/1111* (2013.01); *H03M 13/27* (2013.01); *H03M 13/2909* (2013.01); *H03M 13/618* (2013.01); *G11C 29/52* (2013.01)

(58) Field of Classification Search
None
See application file for complete search history.

(56) References Cited

U.S. PATENT DOCUMENTS 8,412,987 B2 *  4/2013  Billing ................ G06F 11/1008
714/710
8,566,669 B2 * 10/2013  Schuette ............. G06F 11/1048
711/1

(Continued)

OTHER PUBLICATIONS

Divsalar, D. et al., "Protograph LDPC Codes Over Burst Erasure Channels", *Jet Propulsion Laboratory, California Institute of Technology*, 2006, 7 pages.

(Continued)

*Primary Examiner* — Justin R Knapp
(74) *Attorney, Agent, or Firm* — Dickinson Wright PLLC

(57) ABSTRACT

A non-volatile memory system may be configured to generate a codeword with first-type parity bits and one or more second-type parity bits. If a storage location in which the codeword is to be stored includes one or more bad memory cells, the bit sequence of the codeword may be arranged so that at least some of the second-type parity bits are stored in the bad memory cells. During decoding, a first set of syndrome values may be determined for a first set of check nodes and a second set of syndrome values may be determined for a second set of check nodes. In some examples, a syndrome weight used for determining if convergence is achieved may be calculated using check nodes that are unassociated with the second-type parity bits.

22 Claims, 14 Drawing Sheets

(51) Int. Cl.
G06F 3/06 (2006.01)
G11C 29/52 (2006.01)
H03M 13/11 (2006.01)
H03M 13/27 (2006.01)
H03M 13/29 (2006.01)
H03M 13/00 (2006.01)

(56) References Cited

U.S. PATENT DOCUMENTS

| | | | |
|---|---|---|---|
| 9,374,107 | B1 | 6/2016 | Hinton et al. |
| 9,436,549 | B2 | 9/2016 | Tuer et al. |
| 2007/0162815 | A1 | 7/2007 | El-Khamy et al. |
| 2011/0047433 | A1 | 2/2011 | Abu-Surra et al. |
| 2011/0066916 | A1 | 3/2011 | Abu-Surra et al. |
| 2014/0157087 | A1 | 6/2014 | Yurzola et al. |
| 2016/0343455 | A1* | 11/2016 | Lesartre ............... G11C 29/76 |
| 2017/0359086 | A1 | 12/2017 | Kudekar et al. |

OTHER PUBLICATIONS

Divsalar, D. et al., "Short-Block Protograph-Based LDPC Codes", *NASA Tech Briefs*, Sep. 2010, pp. 45.

Mitchell, D. G., et al., "Constructing Good QC-LDPC Codes by Pre-Lifting Protrographs", *IEEE Information Theory Workshop*, 2012, pp. 202-206.

Mitchell, D. G., et al., "Quasi-Cyclic LDPC Codes Based on Pre-Lifted Protographs", *IEEE Transactions Information Theory*, 2014, pp. 1-19.

Sharon, E. et al, "Constructing LDPC Codes by Error Minimization Progressive Edge Growth", *IEEE Transactions on Communications*, vol. 56, No. 3, Mar. 2008, pp. 359-368.

Sharon, E. et al., "Method for Constructing LDPC Codes With Low Error Floor", *Department of Electrical Engineering, Tel-Aviv University*, Date uknown, 5 pages.

Sharon, E., et al., "Generating Good Finite Length LDPC Codes Based on Lifted Grafts", *Forty-Fourth Annual Allerton Conference*, Sep. 27-29, 2006, pp. 41-50.

Vakilinia, K. et al., "Protograph-Based Raptor-Like LDPC Codes for the Binary Erasure Channel", *Department of Electrical Engineering, University of California*, 2015, 7 pages.

U.S. Appl. No. 15/475,602 entitled, "Use of Multiple Codebooks for Programming Data in Different Memory Areas of a Storage Device", filed Mar. 31, 2017, 136 pages.

* cited by examiner

MULTI-TYPE PARITY BIT GENERATION FOR ENCODING AND DECODING

CROSS-REFERENCE TO RELATED APPLICATION

This application claims the benefit of U.S. Provisional Application No. 62/303,899, filed Mar. 4, 2016. The contents of U.S. Provisional Application No. 62/303,899 are incorporated by reference in their entirety.

BACKGROUND

Memory systems may include storage locations that store data unreliably due to defects that occur during the manufacturing process. One way to deal with the unreliable storage locations and improve yield is to configure the memory with extra replacement storage locations. In addition, memory systems may encode and decode data with parity bits that provide redundancy and error correction capability for the data when read from the memory. Leveraging the unreliable storage locations and extra replacement storage locations for encoding and decoding of the data in order to improve decoding performance metrics may be desirable.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION OF PRESENTLY PREFERRED EMBODIMENTS

Overview

Figure 1A:
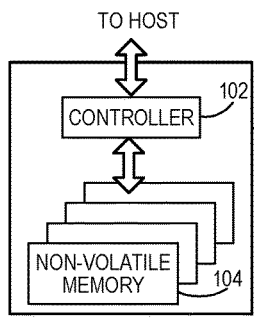
FIG. 1A is a block diagram of an exemplary non-volatile memory system.

By way of introduction, the below embodiments relate to memory systems and methods for encoding and decoding data that includes bits stored in memory elements identified as unreliable. In one embodiment, a memory system includes memory and a controller. The controller is configured to: encode information bits to generate a codeword comprising the information bits, first-type parity bits, and one or more second-type parity bits; identify a storage location of the memory in which to store the codeword, wherein the storage location comprises a bad memory cell; map the a second-type parity bit of the one or more second-type parity bits to the bad memory cell; and store the codeword in the stored location such that the second-type parity bit is stored in the bad memory cell.

In another embodiment, a memory system includes a memory; means for encoding information bits to generate a codeword comprising the information bits, first-type parity bits, and one or more second-type parity bits; means for identifying a storage location of the memory in which to store the codeword, wherein the storage location comprises a bad memory cell; means for mapping the a second-type parity bit of the one or more second-type parity bits to the bad memory cell; and means for storing the codeword in the stored location such that the second-type parity bit is stored in the bad memory cell.

In another embodiment, a method of storing data may be performed. The method includes: determining, with a controller of a memory system, to store data in a storage location of the memory system; identifying, with the controller, a bad memory cell of the storage location; before storing a codeword associated with the data in the storage location, changing, with the controller, which bit of the codeword is to be stored in the bad memory cell; and storing the codeword in the storage location based on the changing.

In some embodiments, prior to the mapping of the second-type parity bit to the bad memory cell, one of the information bits or one of the first-type parity bits is mapped to the bad memory cell.

In some embodiments, the controller encodes the information bits by individually encoding a plurality of portions of the information bits, wherein the first-type parity comprises sub-code parity bits and the one more second-type parity bits includes one or more joint parity bits.

In some embodiments, the controller encodes the information bits with a parity-check matrix that includes a number of columns and a number of rows corresponding to a number of the one or more second-type parity bits of the codeword.

In some embodiments, elements of the parity-check matrix that are in both the columns and the rows corresponding to the one or more second-type parity bits form a lower triangular submatrix of the parity-check matrix.

In some embodiments, elements of the parity-check matrix that are in the columns corresponding to the one or more second-type parity bits and in the rows corresponding to the first-type parity bits are all zeros.

In some embodiments, the number of columns and the number of rows corresponding to the number of the one or more second-type parity bits corresponds to a number of replacement columns for a page of the memory.

In some embodiments, the bad memory cell is switched from being mapped to an information bit or a first-type parity bit of the codeword to a second-type parity bit of the codeword in order to change which bit is stored in the bad memory cell.

In some embodiments, a number of second-type parity bits corresponds to a number of replacement columns associated with a page of the memory.

In some embodiments, a number of second-type parity bits corresponds to a predetermined maximum number of expected bad memory cells.

In another embodiment, a memory system includes: memory storing a codeword comprising information bits, first-type parity bits, and one or more second-type parity bits; and a controller. The controller is configured to: calculate a first syndrome summation value that is a sum of syndrome values associated with a first set of check nodes; calculate a second syndrome summation value that is a sum of syndrome values associated with a second set of one or more check nodes; and flip a bit value of a bit of the codeword based on the first syndrome summation value and the second syndrome summation value.

In some embodiments, a number of the first set of check nodes corresponds to a number of the first-type parity bits and a number of the second set of one or more check nodes corresponds to a number of second-type parity bits.

In some embodiments, in accordance with a Tanner graph, none of the check nodes in the first set of check nodes are connected to a variable associated with the one or more second-type parity bits and at least one of the check nodes of the second set of one or more check nodes is connected to a variable associated with the one or more second-type parity bits.

In some embodiments, the controller determines a syndrome weight of the codeword based on the syndrome values associated with the first set of check nodes but not based on the syndrome values associated with the second set of one or more check nodes.

In some embodiments, the controller further updates the syndrome weight in response to a determination to flip the bit value based on the first syndrome summation value and a number of the first set of check nodes.

In some embodiments, the first syndrome summation value and the second summation value are for a variable of a plurality of variables associated with the codeword, and wherein the controller determines whether to flip bits values associated with the plurality of variables and update the syndrome weight after each determination to flip one of the bit values until convergence is achieved or a maximum number of iterations is reached.

In some embodiments, the controller compares the first syndrome summation value and the second syndrome summation value with at least one minimum threshold value to determine whether to flip the bit value.

In some embodiments, the one or more second-type parity bits comprises a single second-type parity bit, and the second set of one or more second-type parity check nodes comprises a single second-type parity check node, and wherein the at least one minimum threshold includes a first minimum threshold associated with a first case where the single second-type parity check node is satisfied and a second minimum threshold associated with a second case where the single second-type parity check node is unsatisfied.

Other embodiments are possible, and each of the embodiments can be used alone or together in combination. Accordingly, various embodiments will now be described with reference to the attached drawings.

Exemplary Embodiments

The following embodiments describe non-volatile memory systems and related methods for encoding and decoding data that includes bits stored in memory elements identified as unreliable. Before turning to these and other embodiments, the following paragraphs provide a discussion of exemplary non-volatile memory systems and storage modules that can be used with these embodiments. Of course, these are just examples, and other suitable types of non-volatile memory systems and/or storage modules can be used.

FIG. 1A is a block diagram illustrating a non-volatile memory system 100. The non-volatile memory system 100 may include a controller 102 and non-volatile memory that may be made up of one or more non-volatile memory dies 104. As used herein, the term die refers to the set of non-volatile memory cells, and associated circuitry for managing the physical operation of those non-volatile memory cells, that are formed on a single semiconductor substrate. The controller 102 may interface with a host system and transmit command sequences for read, program, and erase operations to the non-volatile memory die(s) 104.

The controller 102 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 102 and the non-volatile memory die(s) 104 may be any suitable flash interface, such as Toggle Mode 200, 400, or 800. In one embodiment, the memory system 100 may be a card based system, such as a secure digital (SD) or a micro secure digital (micro-SD) card. In an alternate embodiment, the system 100 may be part of an embedded memory system.

Although in the example illustrated in FIG. 1A, the non-volatile memory system 100 may include a single channel between the controller 102 and the non-volatile memory die(s) 104, the subject matter described herein is not limited to having a single memory channel. For example, in some NAND memory system architectures, 2, 4, 8 or more NAND channels may exist between the controller and the NAND memory die(s) 104, depending on controller capabilities. In any of the embodiments described herein, more than a single channel may exist between the controller and the memory die(s)s 104, even if a single channel is shown in the drawings.

Figure 1B:
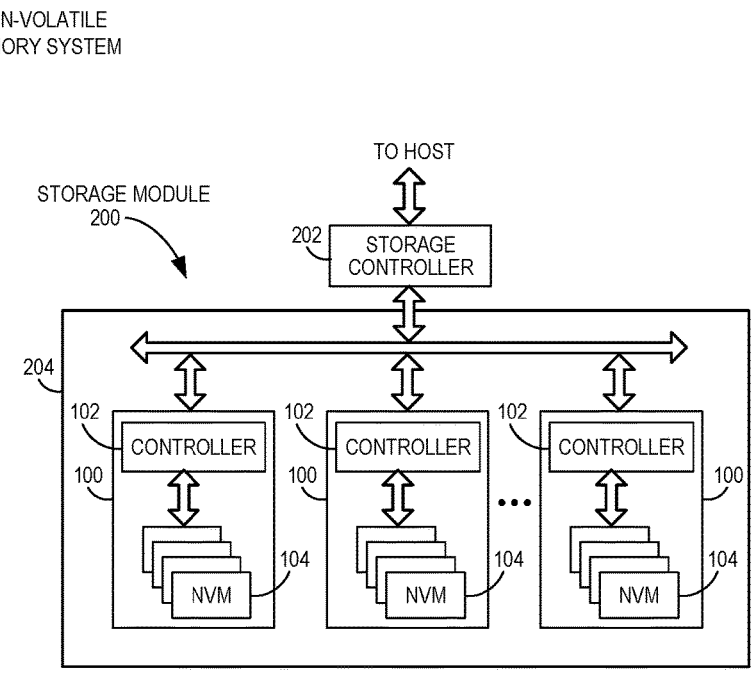
FIG. 1B is a block diagram of a storage module that includes a plurality of non-volatile memory systems.

FIG. 1B illustrates a storage module 200 that includes plural non-volatile memory systems 100. As such, the storage module 200 may include a storage controller 202 that interfaces with a host and with a storage system 204, which includes a plurality of non-volatile memory systems 100. The interface between the storage controller 202 and non-volatile memory systems 100 may be a bus interface, such as a serial advanced technology attachment (SATA), a peripheral component interface express (PCIe) interface, an embedded MultiMediaCard (eMMC) interface, a SD interface, or a Universal Serial Bus (USB) interface, as examples. The storage system 200, in one embodiment, may be a solid state drive (SSD), such as found in portable computing devices, such as laptop computers and tablet computers, and mobile phones.

Figure 1C:
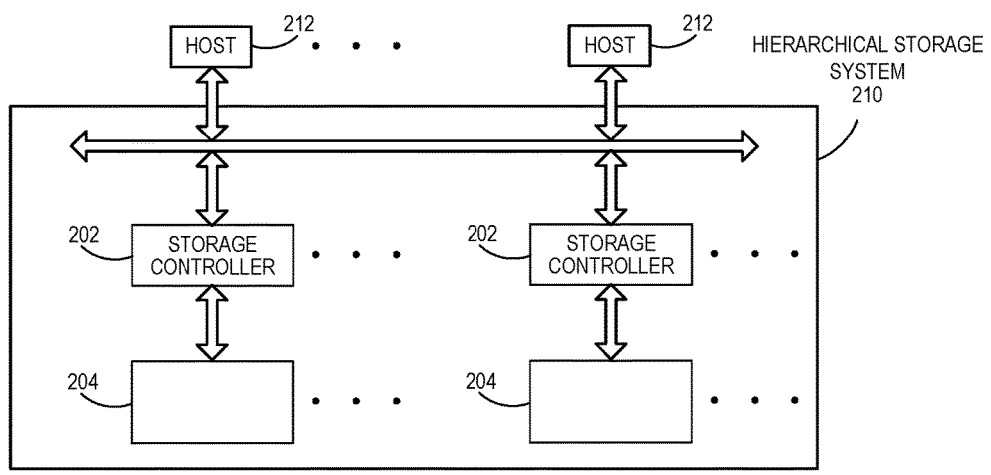
FIG. 1C is a block diagram of a hierarchical storage system.

FIG. 1C is a block diagram illustrating a hierarchical storage system 210. The hierarchical storage system 210 may include a plurality of storage controllers 202, each of which control a respective storage system 204. Host systems 212 may access memories within the hierarchical storage system 210 via a bus interface. Example bus interfaces may include a non-volatile memory express (NVMe), a fiber channel over Ethernet (FCoE) interface, an SD interface, a USB interface, a SATA interface, a PCIe interface, or an eMMC interface as examples. In one embodiment, the storage system 210 illustrated in FIG. 1C may be a rack mountable mass storage system that is accessible by multiple host computers, such as would be found in a data center or other location where mass storage is needed.

Figure 2A:
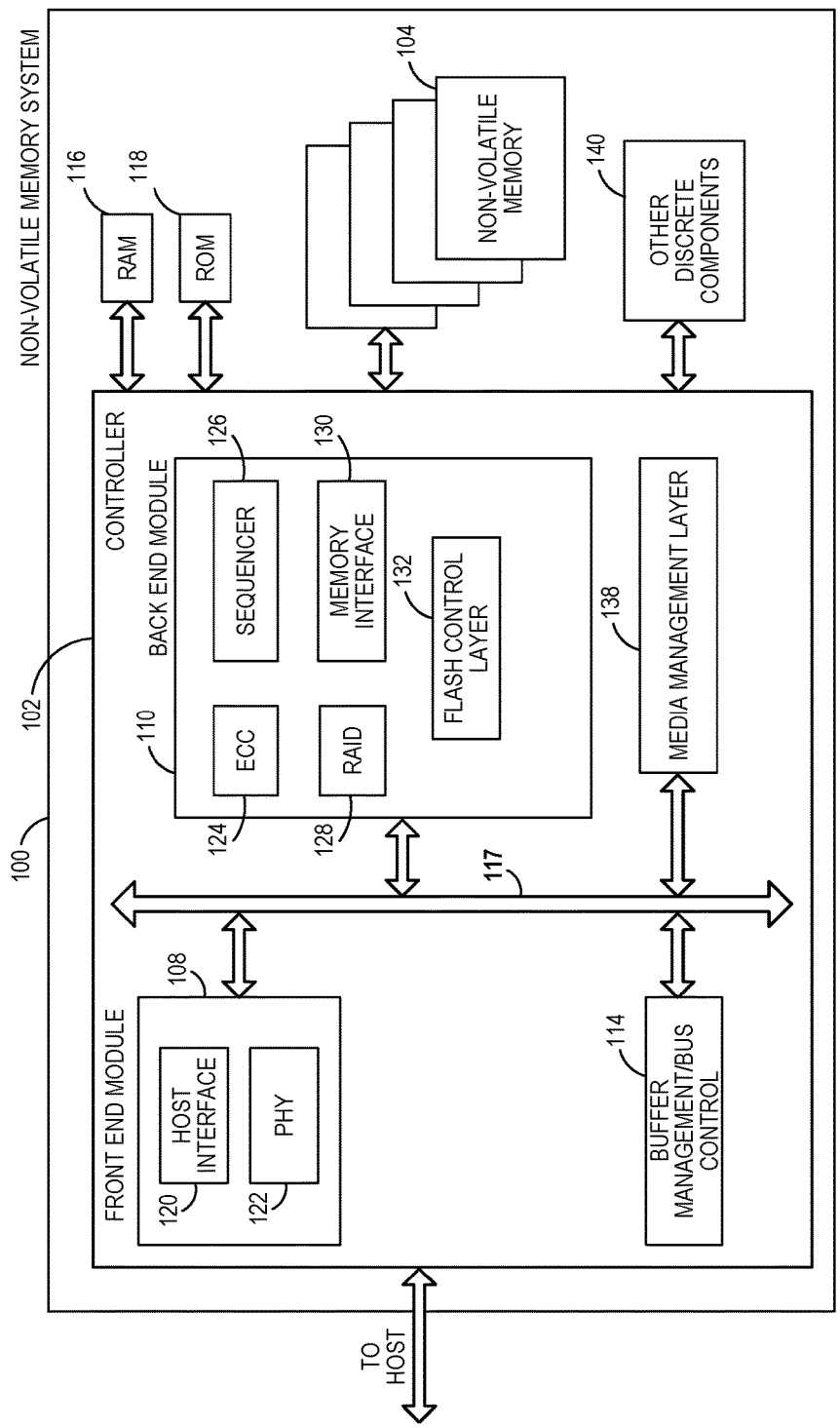
FIG. 2A is a block diagram of exemplary components of a controller of the non-volatile memory system of FIG. 1A.

FIG. 2A is a block diagram illustrating exemplary components of the controller 102 in more detail. The controller 102 may include a front end module 108 that interfaces with a host, a back end module 110 that interfaces with the non-volatile memory die(s) 104, and various other modules that perform various functions of the non-volatile memory system 100. In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 102 may include a buffer manager/bus controller module 114 that manages buffers in random access memory (RAM) 116 and controls the internal bus arbitration for communication on an internal communications bus 117 of the controller 102. A read only memory (ROM) 118 may store and/or access system boot code. Although illustrated in FIG. 2A as located separately from the controller 102, in other embodiments one or both of the RAM 116 and the ROM 118 may be located within the controller 102. In yet other embodiments, portions of RAM 116 and ROM 118 may be located both within the controller 102 and outside the controller 102. Further, in some implementations, the controller 102, the RAM 116, and the ROM 118 may be located on separate semiconductor dies.

Additionally, the front end module 108 may include a host interface 120 and a physical layer interface (PHY) 122 that provide the electrical interface with the host or next level storage controller. The choice of the type of the host interface 120 can depend on the type of memory being used. Examples types of the host interface 120 may include, but are not limited to, SATA, SATA Express, SAS, Fibre Channel, USB, PCIe, and NVMe. The host interface 120 may typically facilitate transfer for data, control signals, and timing signals.

The back end module 110 may include an error correction controller (ECC) engine 124 that encodes the data bytes received from the host, and decodes and error corrects the data bytes read from the non-volatile memory 104. The back end module 110 may also include a command sequencer 126 that generates command sequences, such as program, read, and erase command sequences, to be transmitted to the non-volatile memory die(s) 104. Additionally, the back end module 110 may include a RAID (Redundant Array of Independent Drives) module 128 that manages generation of RAID parity and recovery of failed data. The RAID parity may be used as an additional level of integrity protection for the data being written into the non-volatile memory system 100. In some cases, the RAID module 128 may be a part of the ECC engine 124. A memory interface 130 provides the command sequences to the non-volatile memory die(s) 104 and receives status information from the non-volatile memory die(s) 104. Along with the command sequences and status information, data to be programmed into and read from the non-volatile memory die(s) 104 may be communicated through the memory interface 130. In one embodiment, the memory interface 130 may be a double data rate (DDR) interface, such as a Toggle Mode 200, 400, or 800 interface. A flash control layer 132 may control the overall operation of back end module 110.

Additional modules of the non-volatile memory system 100 illustrated in FIG. 2A may include a media management layer 138, which performs wear leveling of memory cells of the non-volatile memory die 104. The non-volatile memory system 100 may also include other discrete components 140, such as external electrical interfaces, external RAM, resistors, capacitors, or other components that may interface with controller 102. In alternative embodiments, one or more of the RAID module 128, media management layer 138 and buffer management/bus controller 114 are optional components that may not be necessary in the controller 102.

Figure 2B:
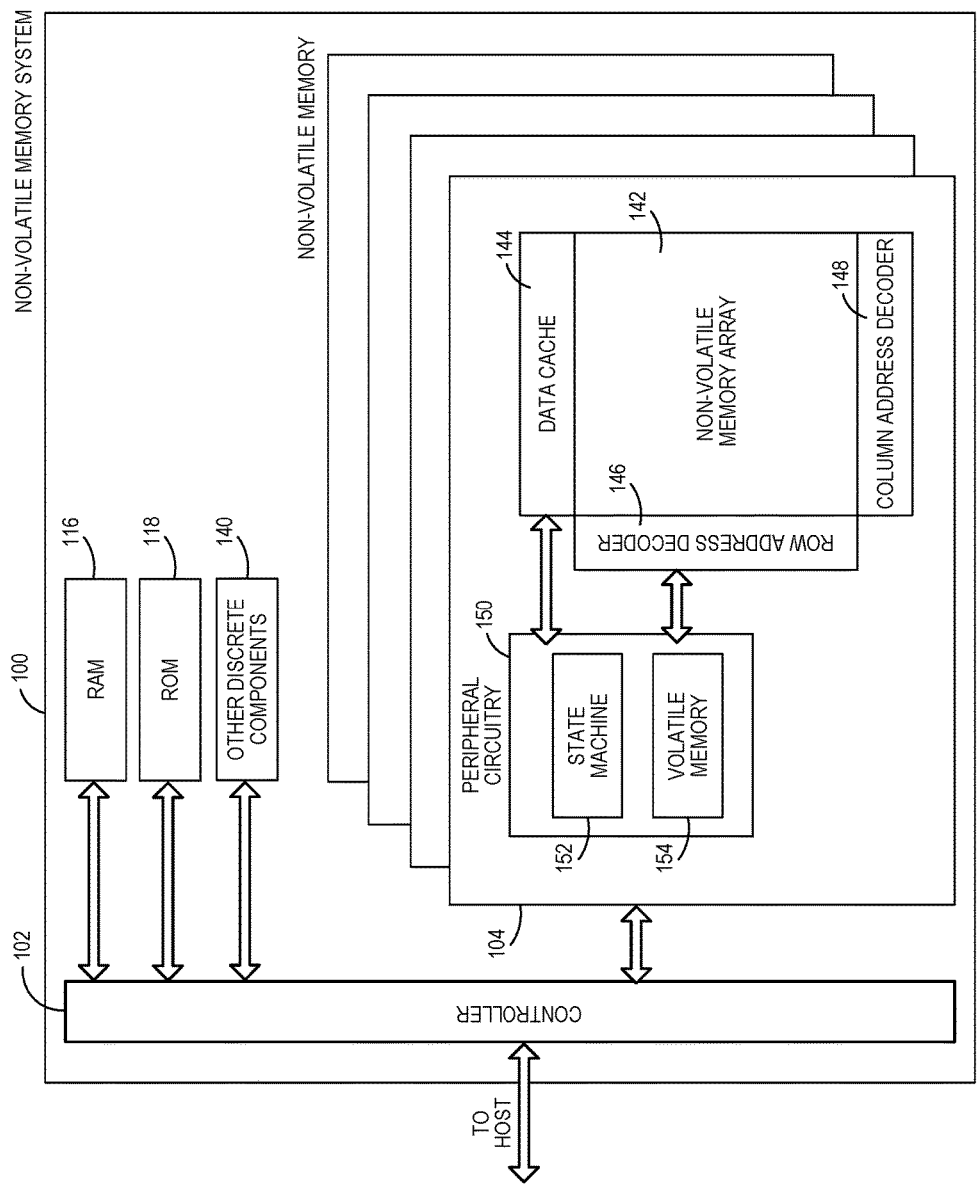
FIG. 2B is a block diagram of exemplary components of a non-volatile memory die of the non-volatile memory system of FIG. 1A.

FIG. 2B is a block diagram illustrating exemplary components of a non-volatile memory die 104 in more detail. The non-volatile memory die 104 may include a non-volatile memory array 142. The non-volatile memory array 142 may include a plurality of non-volatile memory elements or cells, each configured to store one or more bits of data. The non-volatile memory elements or cells may be any suitable non-volatile memory cells, including NAND flash memory cells and/or NOR flash memory cells in a two dimensional and/or three dimensional configuration. The memory cells may take the form of solid-state (e.g., flash) memory cells and can be one-time programmable, few-time programmable, or many-time programmable. In addition, the memory elements or cells may be configured as single-level cells (SLCs) that store a single bit of data per cell, multi-level cells (MLCs) that store multiple bits of data per cell, or combinations thereof. For some example configurations, the multi-level cells (MLCs) may include triple-level cells (TLCs) that store three bits of data per cell.

Additionally, a flash memory cell may include in the array 142 a floating gate transistor (FGT) that has a floating gate and a control gate. The floating gate is surrounded by an insulator or insulating material that helps retain charge in the floating gate. The presence or absence of charges inside the floating gate may cause a shift in a threshold voltage of the FGT, which is used to distinguish logic levels. That is, each FGT's threshold voltage may be indicative of the data stored in the memory cell. Hereafter, FGT, memory element and memory cell may be used interchangeably to refer to the same physical entity.

The memory cells may be disposed in the memory array 142 in accordance with a matrix-like structure of rows and columns of memory cells. At the intersection of a row and a column is a FGT (or memory cell). A column of FGTs may be referred to as a string. FGTs in a string or column may be electrically connected in series. A row of FGTs may be referred to as a page. Control gates of FGTs in a page or row may be electrically connected together.

The memory array 142 may also include wordlines and bitlines connected to the FGTs. Each page of FGTs is coupled to a wordline. In particular, each wordline may be coupled to the control gates of FGTs in a page. In addition, each string of FGTs may be coupled to a bitline. Further, a single string may span across multiple wordlines, and the number of FGTs in a string may be equal to the number of pages in a block.

Figure 3:
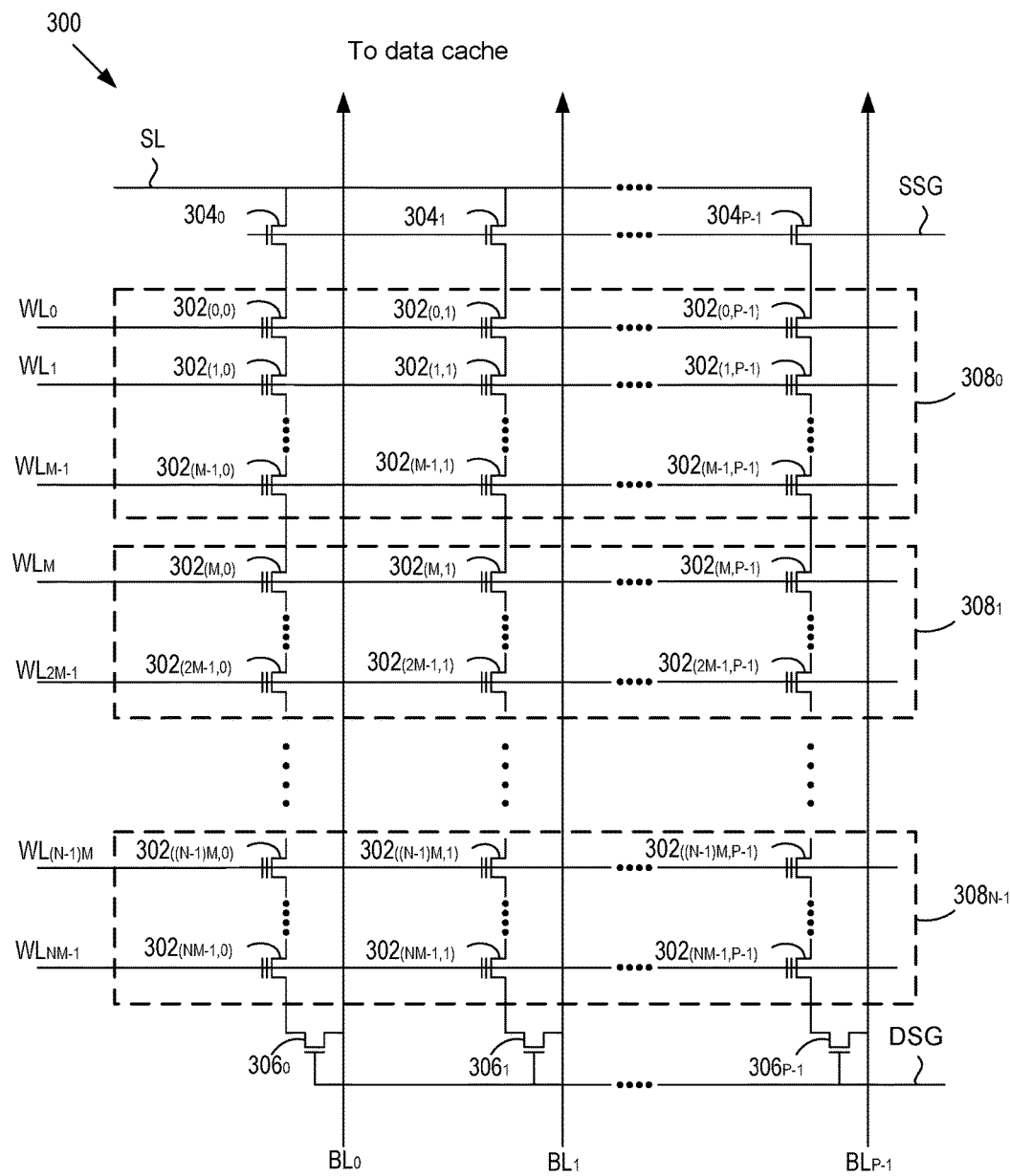
FIG. 3 is a circuit schematic diagram of an exemplary NAND-type flash memory array.

FIG. 3 is a circuit schematic diagram of at least a portion of an exemplary NAND-type flash memory array 300, which may be representative of at least a portion of the memory array 142. The memory array portion 300 may include a P-number of series-connected strings of (N times M) FGTs, each coupled to one of a P-number of bitlines $BL_1$ to $BL_{P-1}$, where N is the number of blocks $308_0$ to $308_{N-1}$ in the memory array 300, and M is the number of pages of FGTs coupled to wordlines WL in each of the N-number of blocks $308_0$ to $308_{N-1}$.

To sense data from the FGTs, a page of FGTs and a corresponding wordline may be selected, and current sensing of bitlines may be employed to determine whether a floating gate of a FGT in the selected page contains charge or not. Current that flows through a string may flow from a source line SL, through the string, to a bitline BL to which the string is coupled. The string may be coupled to the source line SL via a source select transistor, and may be coupled to its associated bitline BL via a drain select transistor. For example, a first string of FGTs $302_{(0,0)}$ to $302_{(NM-1,0)}$ may be coupled to the source line SL via a source select transistor $304_0$ that is connected to the source line SL, and may be coupled to its associated bitline $BL_0$ via a drain select transistor $306_0$. The other strings may be similarly coupled. Switching of source select transistors $304_0$, $304_1$, ..., $304_{P-1}$ may be controlled using a source select gate bias line SSG that supplies a source select gate bias voltage $v_{SSG}$ to turn on an off the source select transistors $304_0$, $304_1$, ..., $304_{P-1}$. Additionally, switching of drain select transistors $306_0$, $306_1$, ..., $306_{P-1}$ may be controlled using a drain select gate bias line DSG that supplies a drain select gate bias voltage $v_{DSG}$ to turn on and off the drain select transistors $306_0$, $306_1$, ..., $306_{P-1}$.

Referring back to FIG. 2B, the non-volatile memory die 104 may further include a page buffer or data cache 144 that caches data that is sensed from and/or that is to be programmed to the memory array 142. The non-volatile memory die 104 may also include a row address decoder 146 and a column address decoder 148. The row address decoder 146 may decode a row address and select a particular wordline in the memory array 142 when reading or writing data to/from the memory cells in the memory array 142. The column address decoder 148 may decode a column address to select a particular group of bitlines in the memory array 142 to be electrically coupled to the data cache 144.

In addition, the non-volatile memory die 104 may include peripheral circuitry 150. The peripheral circuitry 150 may include a state machine 152 that provides status information to the controller 102. Other functionality of the state machine 152 is described in further detail below. The peripheral circuitry 150 may also include volatile memory 154. An example configuration of the volatile memory 154 may include latches, although other configurations are possible.

Figure 4:
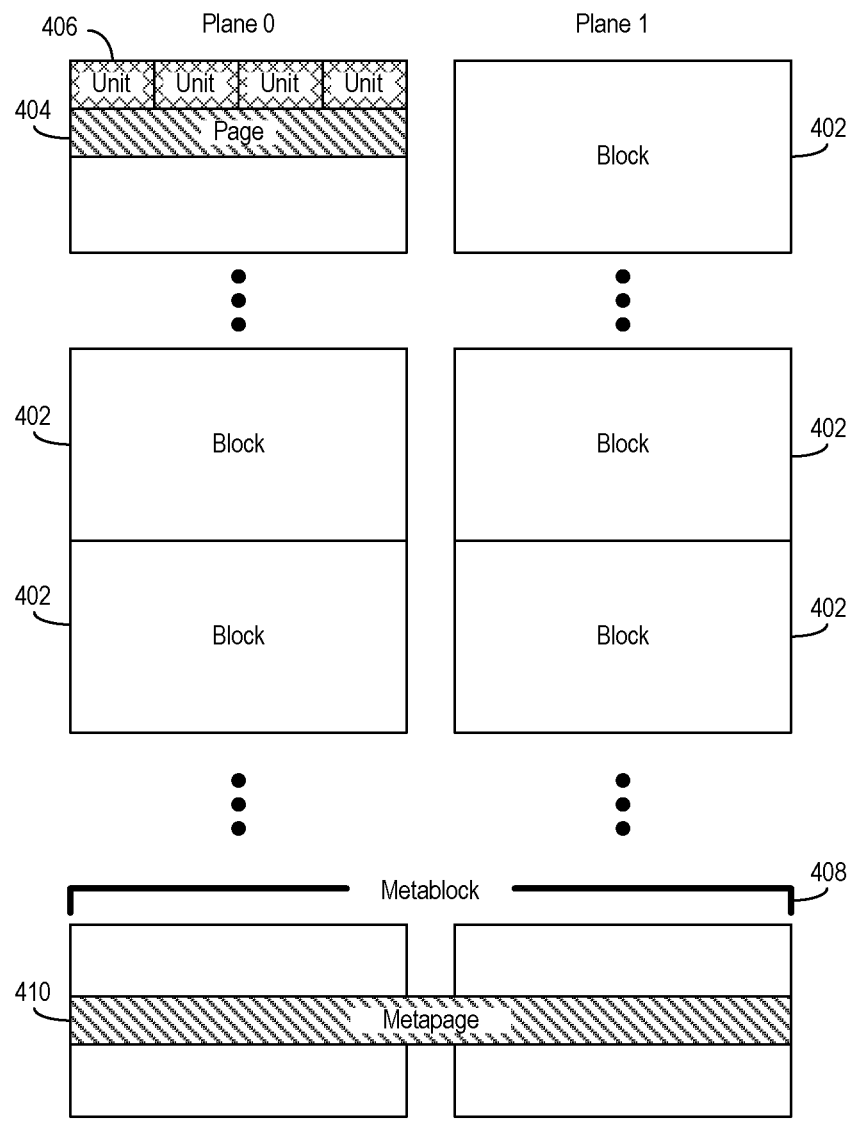
FIG. 4 is a block diagram of an example organizational arrangement or hierarchy of a memory array for flash memory.

Referring to FIG. 4, the memory array 142 and/or a plurality of memory arrays 142 spanning multiple memory dies 104 may have an organizational arrangement or hierarchy under which memory elements or cells of the memory array 142 and/or multiple memory arrays 142 of multiple memory dies 104 may be organized. The controller 102 may be configured to store and access data in accordance with the organizational arrangement or hierarchy.

FIG. 4 is a block diagram of an example organizational arrangement or hierarchy of a memory array 142 for flash memory. As mentioned, for flash memory, the memory cells may be divided or organized into blocks 402, and each block 402 may further be divided into a number of pages 404. Each block 402 may contain the minimum number of memory elements that may be erased together. In addition, each page 404 may be a unit of sensing in the memory array 142. Each individual page 404 may further be divided into segments or units 406, with each segment or unit 406 containing the fewest number of memory cells that may be written to at one time as a basic programming operation. Data stored in a segment or unit of memory cells referred to as a flash memory unit (FMU), an ECC page, or a codeword may contain the amount of data that is written at one time during a basic programming operation and/or the amount of data that can be encoded or decoded by the ECC engine 124 during a single encoding or decoding operation. The pages 404 may be divided into the same number of segments or units. Example numbers of segments or unit may be four or eight, although other numbers are possible. In general, data may be stored in blocks and pages of memory elements non-contiguously (randomly) or contiguously.

In addition, the organizational arrangement or hierarchy may include one or more planes in which each of the blocks 402 may be configured. Generally, a plane includes a "column" of blocks 402, although other configurations may be possible. A single memory array 142 may include a single plane or multiple planes. The example arrangement shown in FIG. 4 includes two planes, Plane 0 and Plane 1. Data stored in different planes may be sensed simultaneously or independently.

Additionally, the organizational arrangement or hierarchy may include metablocks 408 and metapages 410. A metablock address or number identifying a metablock may be mapped to and/or correspond to a logical address (e.g., a logical group number) provided by a host. A metablock 408 and a metapage 410 may span or be distributed across a respective single block and page in a single plane, or alternatively, may span or be distributed across respective multiple blocks and multiple pages across multiple planes. FIG. 4 shows the metablock 408 and the metapage 410 spanning across two planes, Plane 0 and Plane 1. Depending on the organizational arrangement, metablocks 408 and metapages 410 spanning across multiple planes may span across only those planes of a single memory die 104, or alternatively may span across multiple planes located of multiple memory dies 104.

Referring back to FIG. 3, the organizational arrangement or hierarchy may also group the bitlines (BL) into groups (otherwise referred to as columns) of bitlines (BL). Grouping the bitlines may reduce the complexity of addressing the storage locations of the array in that a column address over a page may be identified on the basis of groups (or columns) of bitlines, rather than on a bitline-by-bitline basis. In one example, a block 308 may include 16,000 bitlines (i.e., P=16,000), and every sixteen bitlines BL may be grouped together in a group (or column). Grouping the 16,000 bitlines BLs into groups or columns of sixteen may yield only 1,000 column addresses over a page, rather than 16,000 column addresses.

At some point during the lifetime of the non-volatile memory system 100, some of the memory elements of an array may store data unreliably. The memory elements may store data unreliably from the beginning of its life, such as upon being manufactured, or may initially store data reliably, but may then store data unreliably after a period of operation. There may be various reasons why these memory elements store data unreliably, such as due to open circuits, closed circuits, short circuits, endurance or retention issues (e.g., a memory element has exceeded a certain threshold number of program/erase cycles), or as a result of program disturb (when a bit is programmed into a memory element and then later, a neighboring memory element (from the same wordline or an adjacent wordline) is programmed at a higher state, causing the first memory element to be programmed at a slightly higher state). Whatever the reason, memory elements may be or become unreliable, and as a result may not reliably return data at the values at which the data was programmed.

For purposes of the present description, the term "bad" may be used interchangeably with "unreliable." Accordingly, the term "bad" may be used in conjunction with various storage locations or components of an array (e.g., memory elements, bit lines, bitline groups, or other groupings or zones of memory elements) to indicate those storage locations or components as unreliable and/or that are at least identified in the non-volatile memory system 100 as being unreliable. Similarly, the term "good" may be used to refer to reliable storage locations or components and/or that are identified in the non-volatile memory system 100 as being reliable. In addition, the terms "bad" and "good" may be used in conjunction with data (including bits of data) to indicate that the data is to be stored or is being stored in reliable and unreliable storage locations, respectively.

In some situations, memory elements coupled to the same bitline may be similarly unreliable. That is, if one memory element coupled to a particular bitline is unreliable, the other memory elements that are coupled to that bitline may also be unreliable. Accordingly, the controller 102 may be configured to identify unreliable memory elements on a bitline basis. If the controller 102 identifies a bitline as unreliable, it may presume that all of the memory elements coupled to that bitline are bad or unreliable. In addition, if the controller 102 identifies a particular memory element as unreliable, it may presume that the other memory elements coupled to the same bitline are also unreliable and identify that bitline as an unreliable or bad bitline. Also, if the controller 102 does not identify any memory elements in a bitline as being unreliable, it may identify that bitline as a reliable or good bitline.

In addition, the controller 102 may be configured to identify reliable/good and unreliable/bad columns of bitlines. For example, if the controller 102 identifies at least one bitline in a column as unreliable, it may identify all of the bitlines in that column as bad, or generally that the column is unreliable or bad. Alternatively, if the controller 102 does not identify any bitlines in a column as unreliable, it may identify that as good or reliable.

In some example configurations, the controller 102 may be configured to identify some of the columns as replacement columns. That is, the memory arrays 142 of the memory dies 104 may be configured with replacement columns that are meant to offset the bad columns. In some methods of programming, data to be written into a bad column is instead written into a replacement column. In some example configurations, the number of replacement columns in the memory dies 104 may correspond to a predetermined maximum number of bad columns in a page of storage that the memory dies are expected or anticipated to initially have upon manufacture. An example predetermined maximum number may be 100, although other numbers are possible. In other example configurations, the number of replacement columns may be less than the predetermined maximum number of bad columns. This way, it is possible for the number of actual bad columns in a given die, block, or page, is greater than the number of corresponding replacement columns.

Bad storage locations may be identified and stored in one or more bad storage databases. The controller 102 may be configured to access the bad storage location database(s) in order to identify the bad storage locations. The bad storage database(s) may identify the bad storage locations as bad columns, bad bitlines, or a combination thereof. Other ways that the bad storage database(s) may identify the bad storage locations may be possible. Additionally, the bad storage database(s) may be organized and/or managed in various ways. For example, upon manufacture of the memory system 100, storage locations that are initially identified as being bad may be identified and stored in one database, while storage locations initially identified as good but then later identified as bad after operation of the memory system 100 may be stored in another database. Alternatively, the bad storage locations that are initially bad and bad storage locations that later become bad may be combined into a single database. For example, the bad storage database may be initially populated with storage locations that are initially identified as bad upon manufacture. The controller 102 may then update the database as it identified bad storage locations upon manufacture. Various ways of organizing and managing a bad storage database are possible.

In addition, the bad storage database may be stored in any or a plurality of storage locations within the non-volatile memory system 100 and/or external to the non-volatile memory system 100. For example, a bad storage database may be stored in the array having the storage locations that the database identifies. Accordingly, for multi-die systems 100, each die 104 may store an associated bad storage database. Alternatively, one of the dies 104 may store all of the databases for all of the dies 104. Various other configurations for storing the bad storage database(s) for multi-die systems 100 may be possible. Additionally, for some example configurations, the controller 102 may be configured to load a copy of the databases(s) into RAM 116 to manage the database(s), such as during initialization and/or when reading and/or writing data to a particular die 104, and may update the versions of the database(s) stored in the non-volatile memory dies 104 as appropriate.

The non-volatile memory system 100 may use information about the bad storage locations when encoding and decoding data. In general, the non-volatile memory system 100 may store data in the memory dies 104 as codewords. Each codeword may include information data (bits) and parity data (bits). The information bits may include payload data (bits), which includes the data that the host wants written to and read from the non-volatile memory dies 104. The information bits may also include header data (bits), which may include various information about the payload data, such as logical address information, the write source, when the data is written (timestamp), flag fields, reversion numbers, and scrambler seeds as non-limiting examples. The parity bits may be generated during encoding in order to detect and correct errors of the header and payload portions of the data during a decoding phase of a read operation to read the data from the non-volatile memory die 104.

During the encoding process, the non-volatile memory system 100 may be configured to generate, for each codeword, two types of parity bits—first type parity bits and second type parity bits. In some example configurations, if the segment of the page in which a codeword is to be stored has bad storage locations, the second type parity may be mapped to and stored in the bad storage locations. In addition or alternatively, information bits, the first type parity bits, the second type parity bits, or some combination thereof, may be stored in the replacement storage locations depending on how many bad storage locations there are in the segment. In addition or alternatively, the number of second type parity bits that are generated for a codeword may depend on and/or correspond to the number of replacement storage locations and/or the predetermined number of maximum bad storage locations that a page is expected or anticipated to have.

Figure 5:
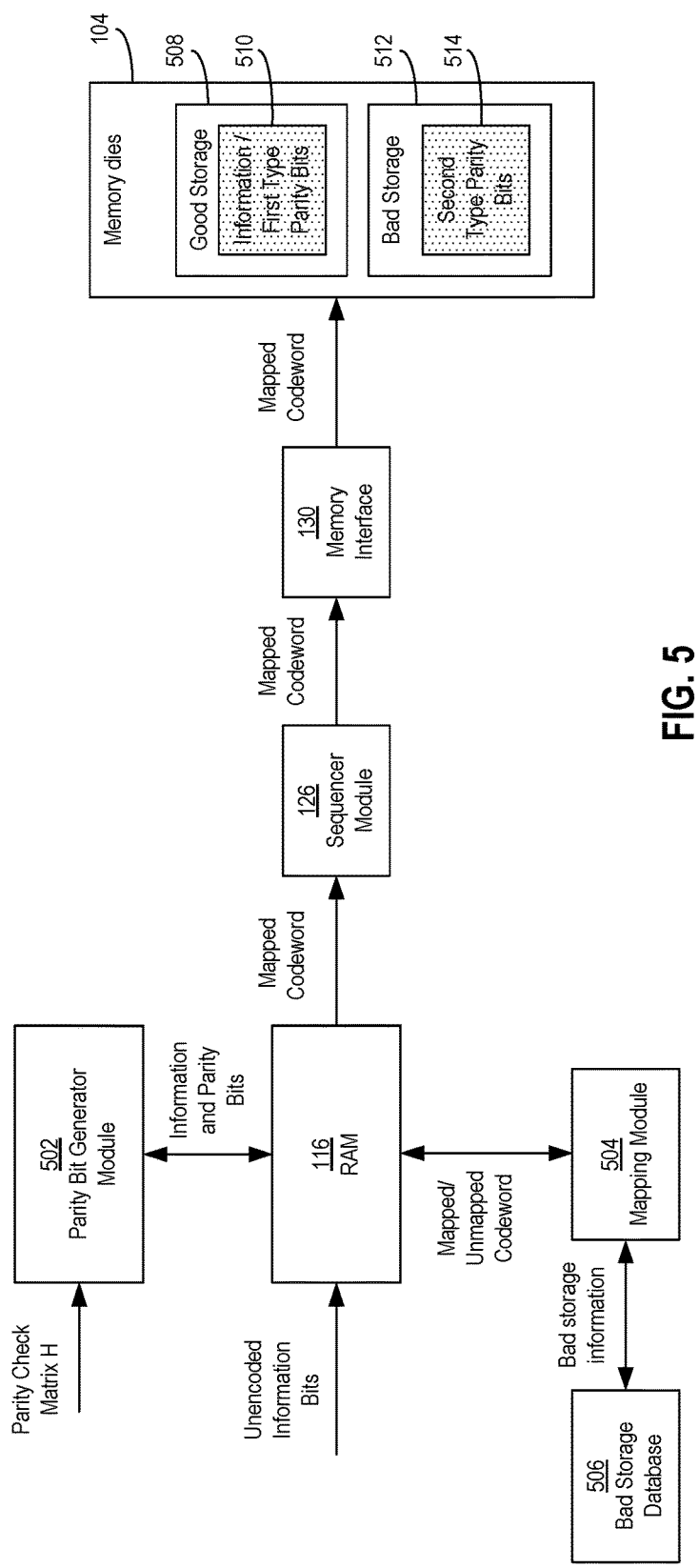
FIG. 5 is a block diagram of exemplary modules of the controller of FIG. 2A used to perform an encoding process.

FIG. 5 shows a block diagram of components of the controller 102 that may be involved in an encoding process of a write operation to write data into a non-volatile memory die 104. For some example configurations, the components other than the RAM 116 may be components of the ECC engine 124, although in other example configurations, some or all of these components may be considered components separate from the ECC engine 124. In addition to the RAM 116, the components involved in the encoding process may include a parity bit generator module 502, a mapping module 504, and a bad column database 506.

Prior to the encoding process, the information bits to be written into the non-volatile memory 104, including the payload data received from a host, may be loaded in the RAM 116 in an unencoded (e.g., raw) format. After the information bits are loaded into the RAM 116, the parity bit generator module 502 may retrieve the information bits and generate the parity bits associated with the information bits. The parity bits that are generated may include first type parity bits and second type parity bits. The parity bit generator module 502 may generate the parity bits using low-density parity-check (LDPC) codes. In particular, the parity bit generator module 502 may utilize a parity-check matrix H and generate parity bits such that following matrix equation is satisfied:

$$H\omega=0, \quad (1)$$

where H is the parity-check matrix and ω is the codeword including the information bits and the parity bits. The codeword ω may be formatted such the first K bits of the codeword ω are equal to an information bit sequence β of the information bits, and the last M bits of the codeword ω are equal to the parity bit sequence δ of the parity bits. The parity bit generator module 502 may then generate the parity bits such that the following equation is satisfied:

$$H \cdot \begin{bmatrix} \beta \\ \delta \end{bmatrix} = 0. \quad (2)$$

In some LDPC encoding schemes, the parity bit generator module 502 may generate the parity bit sequence δ may be taking advantage of the sparse nature of the parity-check matrix H in accordance with LDPC. Example configurations of the parity bit generator module 502 are described in further detail below.

After the parity bits are generated, the information bits and the parity bits may be stored in the RAM 116 as an unmapped codeword ω. An unmapped codeword ω may be a codeword including second-type parity bits that have not yet been mapped to bad storage locations of the segment in which it is to be stored. In this sense, a mapping links a bit (or a group of bits) with a memory cell (or a group of memory cells). A bit mapped to a memory cell is stored or is to be stored in that memory cell. Assuming that the segment in which an unmapped codeword ω is known at the time the unmapped codeword ω is loaded in the RAM 116, if that segment has bad memory cells, an initial mapping of the bits of the unmapped codeword ω may map information bits and/or first-type parity bits to those bad memory cells.

After the unmapped codeword ω is stored in the RAM 116, the mapping module 504 may create a mapping (or update the initial mapping) so that if the segment into which the codeword ω is to be stored has bad memory cells, the second-type parity bits may be mapped to those bad memory cells. Also, after the mapping, information bits and first-type parity bits of the codeword ω that were initially mapped to bad memory cells may be mapped to good memory cells, which may be good memory cells that were initially mapped to second-type parity bits. In other words, bad memory cells may be switched from being mapped to information bits and/or first-type parity bits may now be mapped to second-type parity bits following the mapping. In this way, if the segment into which the codeword ω is to be stored has bad memory cells and if initially, information bits and/or first-type parity bits are to be initially stored in those bad memory cells, the mapping module 504 may change which bits are to be stored in the bad memory cells so that the second-type parity bits instead of the information bits or first-type parity bits are stored in the bad memory cells. In some instances, some of the second-type parity bits may be initially mapped to replacement memory cells. After the update in the mapping, those second-type parity bits may be re-mapped to bad memory cells and the information and/or first-type parity bits originally mapped to the bad memory cells may be mapped to the replacement memory cells. The mapping module 504 may access the bad storage database 506 to identify whether the segment has bad memory cells and if so, where they are located.

Also, the final mapping may depend on the number of bad memory cells and the number of second-type parity bits. For example, suppose 32 second-type parity bits (or two columns of second-type parity) are generated, and those second-type parity bits are initially mapped to replacement columns. Also, suppose that the segment has one bad column. After the mapping is performed by the mapping module 504, the one of the two second-type parity columns of data may be mapped to the one bad column of storage, while the other second-type parity column of data may remain mapped to the same replacement column. Various ways of performing the mapping so that bad storage locations store second-type parity bits instead of information bits or first-type memory bits may be possible.

Also, various ways of modifying or manipulating the codeword ω so that the bad memory cells store the second-type parity bits may be possible. For example, the mapping module 504 may change or modify the information bit sequence β and the parity bit sequence δ and/or an interleaving order of the bit sequences β, δ as appropriate. The codeword ω after it has been mapped (or re-mapped) by the mapping module 504 may be referred to as a mapped codeword ω.

Figure 6A:
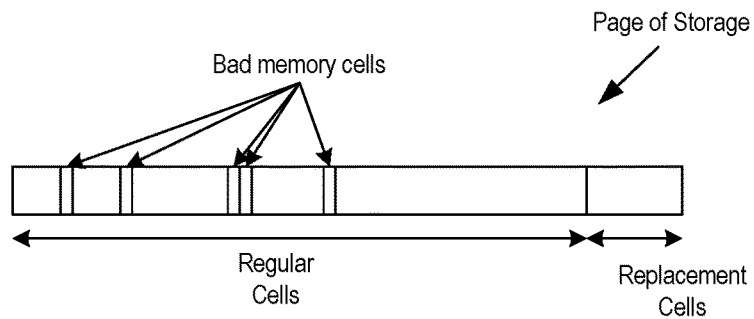
FIG. 6A is a schematic diagram of an example physical layout of a page of memory.
Figure 6B:
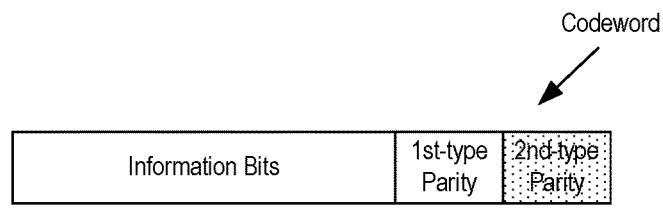
FIG. 6B is a schematic diagram of a bit sequence of a codeword.
Figure 6C:
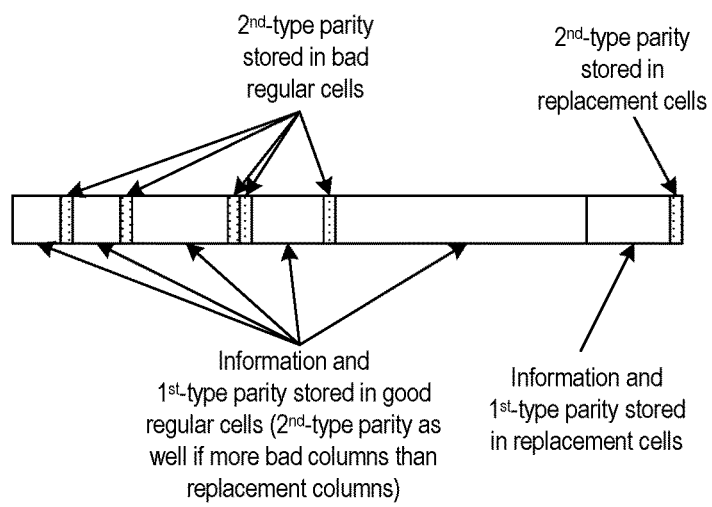
FIG. 6C is a schematic diagram of the example physical layout of FIG. 6A storing one or more codewords having first-type and second-type parity.

FIGS. 6A-6C illustrate an example mapping. FIG. 6A shows a schematic diagram of an example physical layout of a page of storage in the memory dies that is configured to store one or more codewords. As shown in FIG. 6A, the storage page may include regular cells and replacement cells. Regular cells may be the default memory cells designated for storage of the codewords. The replacement cells may be backup cells that are designated for storage of data in case that there are bad memory cells. FIG. 6A shows the regular cells as including five bad memory cells among the regular cells. Note that in some example configurations, the bad memory cells may be part of bad bitlines and/or bad columns.

FIG. 6B shows a schematic diagram of a bit sequence of a codeword. As shown in FIG. 6B, the codeword may include information bits and parity bits including first-type parity bits and second-type parity bits. If the codeword shown in FIG. 6B were to be stored in the storage page of FIG. 6A, then some of the information bits and/or the first-type parity bits may be stored in the bad memory cells.

FIG. 6C shows a schematic diagram of the example physical layout of FIG. 6A storing one or more codewords having first-type and second-type parity. As shown in FIG. 6C, the bad memory cells are storing second-type parity bits, and the good regular cells are storing information bits and first-type parity bits. FIG. 6C also shows the replacement cells storing information bits and first and second-type parity bits. The second-type parity bits may be stored in the replacement cells if there are more second-type parity than bad memory cells.

Also, the schematic diagram shown in FIG. 6C shows a mapping for configurations where the second-type parity is generated based on the storage page including replacement cells. That is, the size of the information bits and first-type parity bits may correspond to and/or be equal to the size of the regular cells, the number of second-type parity that is generated may depend on the number of replacement cells. As shown in FIG. 6C, since at least some of the second-type parity is stored in the bad regular cells, then some of the information bits and/or first-type parity bits that would be stored in the bad memory cells are instead stored in the replacement cells. In other example configurations, the total size of the information bits, first-type parity bits, and second-type parity bits may be equal to the size of the regular cells. For these other configurations, the mapping may be updated so that second-type parity bits originally mapped to good regular cells are mapped to bad regular cells and the information bits and/or first-type parity bits originally mapped to bad regular cells are mapped to good regular cells. However, for these other configurations, the replacement cells may still not be utilized. In still other example configurations, the number of replacement cells may be less than the number of bad memory cells, which may cause at least some of the second-type parity bits to be stored in the good regular cells. Other ways of having bad memory cells store second-type parity bits while utilizing only the regular cells or both the regular cells and the replacement cells for storage of the codewords may be possible.

Referring back to FIG. 5, after the mapping module 504 performs the mapping, the mapped codeword ω may be programmed into the memory dies 104. For example, the sequencer module 126 may generate one or more context commands, such as a pair of data transfer and program context commands for example, to have the mapped codeword ω transferred from the RAM 116 to a segment of a page of the non-volatile memory dies 104. FIG. 5 shows good storage locations 508, which may include good memory cells, good bitlines, or good columns, storing information bits and first-type parity bits 510, and bad storage locations 512, which may include bad memory cells, bad bitlines, or bad columns, storing second-type parity bits 514. Also, although not shown, in instances where there are more second-type parity bits than bad storage locations, then some of the second-type parity bits may also be stored in good storage locations.

Figure 7:
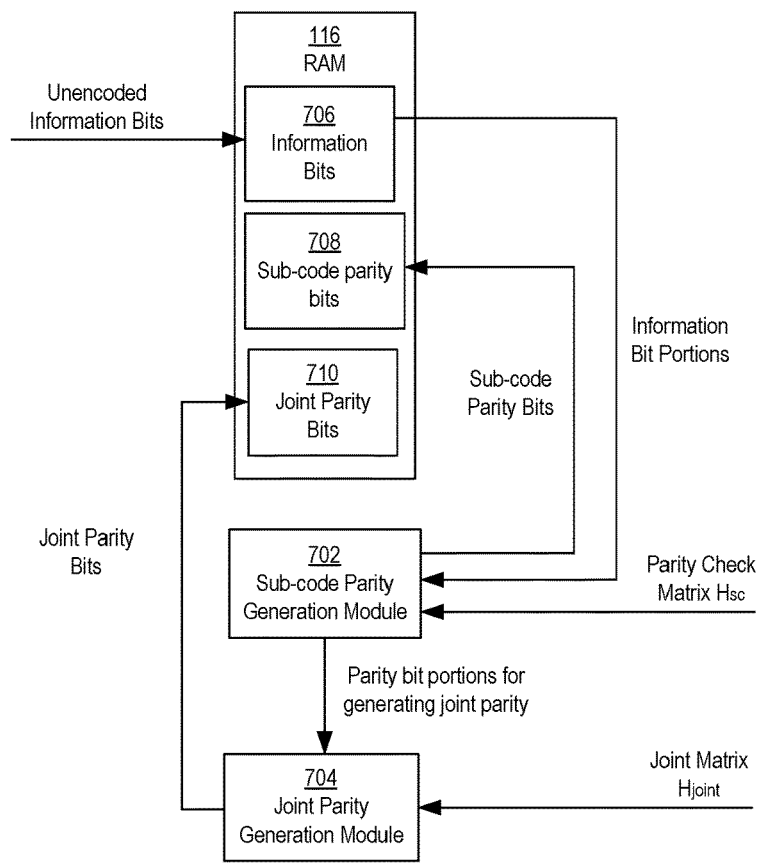
FIG. 7 is a block diagram of an example configuration of a parity bit generator module of FIG. 5.

FIG. 7 shows a block diagram of an example configuration of the parity bit generator module 502 that is configured to generate first-type and second-type parity bits of codewords. As described in further detail below, the information bit sequence β may be divided or separated into a predetermined number of portions. An example may be a 4 kilobyte (kB) information bit sequence that is divided into four 1 kB bit sequence portions. Sub-code parity may be generated separately for each of the information bit sequence portions. Additionally, joint parity may be generated collectively for the bit sequence portions. The sub-code parity may be the first-type parity and the joint parity may be the second-type parity, as previously described with reference to FIG. 5.

In further detail, the components of the parity bit generator module 502 for the example configuration shown in FIG. 7 may include a sub-code parity generation module 702 and a joint parity generation module 704. Also, the RAM 116 may be separated or organized into an information bit portion 706 designated for storage of information bits of a codeword, a sub-code parity bit portion 708 designated for storage of sub-code parity bits of the codeword, and a joint parity bit portion 710 designated for storage of joint parity bits of the codeword.

Figure 7A:
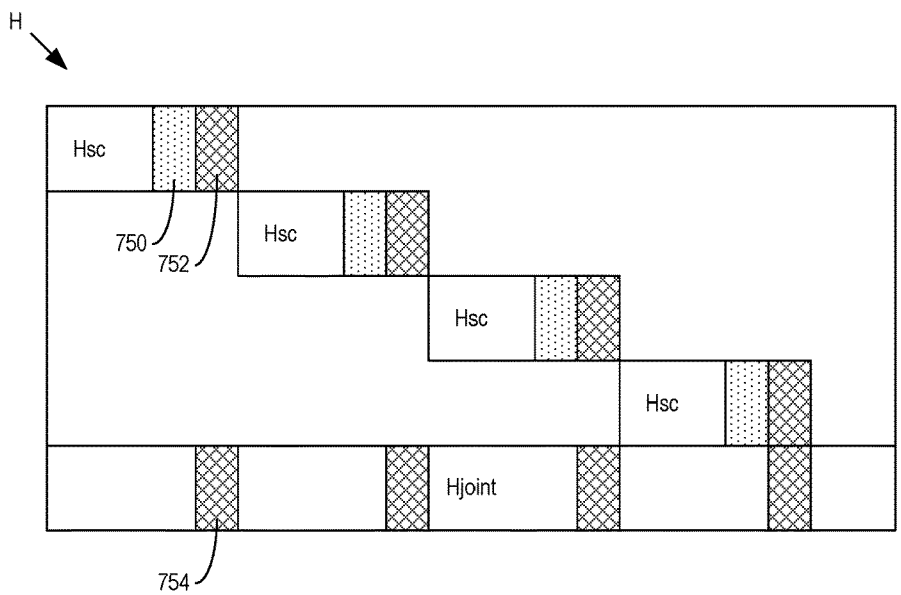
FIG. 7A is a schematic diagram of an example parity-check matrix associated with generation of subcode parity and joint parity.

The unencoded information bit sequence β may be initially stored in the information bit portion 706. The sub-code parity generation module 702 may encode a first portion of the information bit sequence β using a parity-check matrix $H_{sc}$ in order to generate a first parity bit sequence $\delta_1$. For this configuration, the parity-check matrix $H_{sc}$ may be dimensioned according to the size or length of the portions of the information bit sequence β, rather than a total length or size of the information bit sequence β. In some example configurations, the parity-check matrix $H_{sc}$ may be and/or correspond to a submatrix portion of a larger parity-check matrix H corresponding to the entire codeword. FIG. 7A shows a schematic diagram of an example configuration of a larger parity-check matrix H. The number of parity check matrices $H_{sc}$ may correspond and/or be equal to the number of portions of the information bit sequence β and/or the number of sub-codewords that are generated. Each of the sub-matrices $H_{sc}$ may include one or more columns 750 corresponding to the sub-code parity and one or more columns 752 corresponding to parity used to generate the joint parity bits. Also the larger parity-check matrix H may include a joint sub-matrix $H_{joint}$ corresponding to the joint parity bits. The joint sub-matrix $H_{joint}$ may include columns in alignment with and/or part of the same column as the columns 752 of the parity check matrices $H_{sc}$. These columns 754 may include elements having bit values of ones or a combination of zeros and ones. The elements of the joint sub-matrix $H_{joint}$ outside of the columns 754 may all have bit values of zeros. In some example configurations, the joint sub-matrix $H_{joint}$ may be input and/or used by the joint parity generation module 704 for generation of the joint parity bits.

Referring back to FIG. 7, the first parity bit sequence $\delta_1$ may be further divided into a first sub-code parity bit portion $\delta_1'$ and a first joint parity bit portion $\delta_1''$. The first sub-code parity bit portion $\delta_1'$ may be transferred to the sub-code parity bit portion 708 of the RAM 116. The combination of the first portion of the information bit sequence β combined with the first sub-code parity bit portion $\delta_1'$ may form a first sub-codeword corresponding to the information bit sequence β. The first joint parity bit portion $\delta_1''$ may be sent to the joint parity generation module 704 for further processing. The joint parity generation module 704 may be configured to perform a mathematical compression operation, such as an XOR operation, on the joint parity bit portions $\delta''$.

The sub-code parity generation module 702 may also encode a second portion of the information bit sequence β using the parity-check matrix $H_{sc}$ in order to generate a second parity bit sequence $\delta_2$. The second parity bit sequence $\delta_2$ may be further divided into a second sub-code parity bit portion $\delta_2'$ and a second joint parity bit portion $\delta_2''$. The second sub-code parity bit portion $\delta_2'$ may be transferred to the sub-code parity bits portion 706 of the RAM 116. The second portion of the information bit sequence β combined with the second sub-code parity bit portion $\delta_2'$ may form a second sub-codeword corresponding to the information bit sequence β. The second joint parity bit portion $\delta_2''$ may be sent to the joint parity generation module 704. The encoding process may continue in this manner until all of the portions of the information bit sequence β are encoded by the sub-code generation module 702 and sub-code parity bit portions $\delta'$ are generated for each of the information bit portions and stored in the sub-code parity bit portion 708 of the RAM 116.

The joint parity generation module 704 may be configured to generate the joint parity bits for the codeword by performing a bitwise XOR operation on the joint parity bit portions $\delta''$. The result of the XOR operation(s), referred to as a combined joint parity bit portion $\delta'''$, may be the joint parity for the codeword and stored in the joint parity bits portion 710 of the RAM 116. A complete codeword stored in a segment may be a combination of the sub-codewords and the combined joint parity bit portion $\delta'''$.

As mentioned, the sub-code parity bits $\delta'$ may be first-type parity and the combined joint parity bit portion $\delta'''$ may be second-type parity. Accordingly, mapping module 506 (FIG. 5) may perform the mapping on the plurality of sub-code words and the combined joint parity bits $\delta'''$ so that bad storage locations of the memory dies 104 store the combined joint parity bits $\delta'''$ but not the information bits or the sub-code parity bits $\delta'$.

For decoding a codeword generated with the encoding process performed with the components of FIG. 7, the ECC engine 124 (FIG. 2A) may decode the sub-codewords individually without using the combined joint parity bits $\delta'''$. However, if during the decoding, the ECC engine 124 determines that one or more of the bit error rates associated with the sub-codewords is too high, then the ECC engine may decode the sub-codewords by combining the sub-codewords and also using the combined joint parity bits $\delta'''$. Decoding using the sub-code parity $\delta'$ and without the combined joint parity $\delta'''$ may be referred to as the normal or default mode, and decoding using the sub-code parity $\delta'$ and the combined joint parity bits $\delta'''$ may be referred to as a heroics mode.

During the decoding, the ECC engine 124 may know the bad memory locations and that the combined joint parity bits $\delta'''$ are stored in these bad memory locations. Additionally, the ECC engine 124 may utilize the bad storage location information when assigning log likelihood ratio (LLR) values to the bits of the codeword. For example, the ECC engine may assign LLR values indicative of weaker confidence to the combined joint parity bits $\delta'''$ stored in the bad memory locations.

Since the information bits or the sub-code parity bits $\delta'$ are not stored in the bad storage locations, decoding throughput and power is not affected by the amount of bad storage locations when the ECC engine 124 is decoding in the normal or default mode. That is, by mapping the combined joint parity bits $\delta'''$ to the bad memory locations, degradation in decoding performance is only experienced when the ECC engine 124 operates in the heroics mode. Statistically, the heroics mode is a rare decoding mode and so mapping the combined joint parity bits $\delta'''$ to the bad storage locations has an insignificant or negligible effect on the decoding performance and power consumption of the ECC engine 124.

Figure 8:
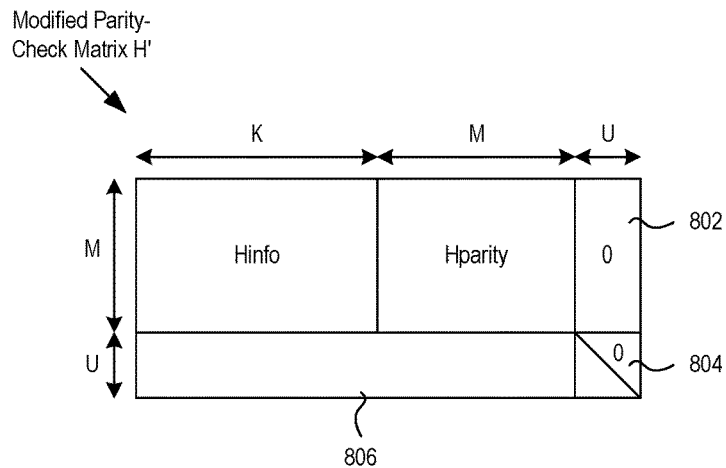
FIG. 8 is a schematic diagram of an example modified parity-check matrix that may be the parity bit generator module of FIG. 5.

FIG. 8 shows a schematic diagram of an example modified parity-check matrix H', which may be used as the parity-check matrix H by the parity bit generator module 502 of FIG. 5 for another example embodiment of encoding information bits to generate a codeword. The modified parity-check matrix H' may be a modified version of a standard parity-check matrix used to encode and decode an entire codeword, as opposed to portions of a codeword as described above with reference to FIG. 5. A standard parity-check matrix may include a first submatrix $H_{info}$ and a second submatrix $H_{parity}$. The first submatrix $H_{info}$ may include a K-number of columns that is equal to a K-number of bits in the information bit sequence β that the parity-check matrix is to encode and decode. The second submatrix $H_{parity}$ may include an M-number of columns that is equal to the M-number of bits in the parity bit sequence δ. Also, as shown in FIG. 8, each of the first submatrix $H_{info}$ and the second submatrix $H_{parity}$ have an M-number of rows equal to the M-number of bits in the parity bit sequence δ.

Additionally, the first submatrix $H_{info}$ and the second submatrix $H_{parity}$ are positioned relative to each other such that the last column of the first submatrix $H_{info}$ is adjacent to the first column of the second submatrix $H_{parity}$. Also, the order of the rows are common amongst the first and second submatrices $H_{info}$, $H_{parity}$. In other words, the first row of the first submatrix $H_{info}$ forms a common row with the first row of the second submatrix $H_{parity}$, and so on. Further, the elements of the first and second submatrices $H_{info}$, $H_{parity}$ (M by K elements for the first submatrix $H_{info}$ and M by M elements for the second submatrix $H_{parity}$) may each include binary "0" and "1" values. The makeup of the 0 and 1 values may be in accordance with various encoding schemes, such as LDPC or Quasi-Cyclic (QC)-LDPC codes, as examples.

The modified parity-check matrix H' may build upon a standard parity-check matrix by appending a U-number of columns and a U-number of rows to the first and second submatrices $H_{info}$, $H_{parity}$, where U is an integer that is one or greater. For the modified parity-check matrix H', the number M may correspond to the number of first-type parity bits for a codeword, and the number U may correspond to the number of second-type parity bits for a codeword. For clarity, the columns of the modified parity-check matrix H' that include the columns of the first submatrix $H_{info}$ may be referred to as K columns, the columns of the modified parity-check matrix H' that include the columns of the second submatrix $H_{parity}$ may be referred to as M columns, and the U-number of additional columns of the modified parity-check matrix H' may be referred to as U columns. Similarly, the rows of the modified parity-check matrix H' that include rows of the first and second submatrices $H_{info}$, $H_{parity}$ may be referred to as M rows, and the U-number of additional rows of the modified parity-check matrix H' may be referred to as U rows.

In some example configurations, the number U may correspond to the number of replacement cells in a storage page, which as previously described, may correspond to a predetermined maximum number of bad memory cells expected or anticipated in a page. For example, suppose a block is configured to have 100 replacement columns, or 1600 replacement bitlines. Further, suppose four codewords can be stored in a page of storage. Accordingly, U may be set to 400. In other examples configurations, the number of replacement cells may be lower than the predetermined maximum number of bad memory cells. However, the number U may correspond to the predetermined maximum number of bad memory cells rather than the number of replacement cells, in which case the number of second-type parity bits may be larger than the number of replacement cells.

As shown in FIG. 8, the elements of the U columns that are also part of the M rows, which form a third submatrix 802, may each have 0 values. Also, elements that are part of both the U columns and the U rows may form a fourth submatrix 804, which may have a lower triangular matrix configuration. That is, the elements positioned in the upper triangular portion of the fourth submatrix 804 may all have 0 values, and the elements positioned in the lower triangular portion of the submatrix 804 may have a combination of 0 and 1 values. Additionally, the elements of the U rows that are also in the K columns or the M columns may form a fifth submatrix 806 and may have a combination of 0 and 1 values.

Referring back to FIG. 5, the parity bit generator module 502 may utilize the modified parity-check matrix H' to generate a M-number of first-type parity and a U-number of second-type parity of codewords. After a codeword is generated with the first-type and second-type parity, the mapping module 504 may perform mapping so that bad memory cells of a segment that is to store the codeword store at least some of the U-number of second-type parity.

Figure 9:
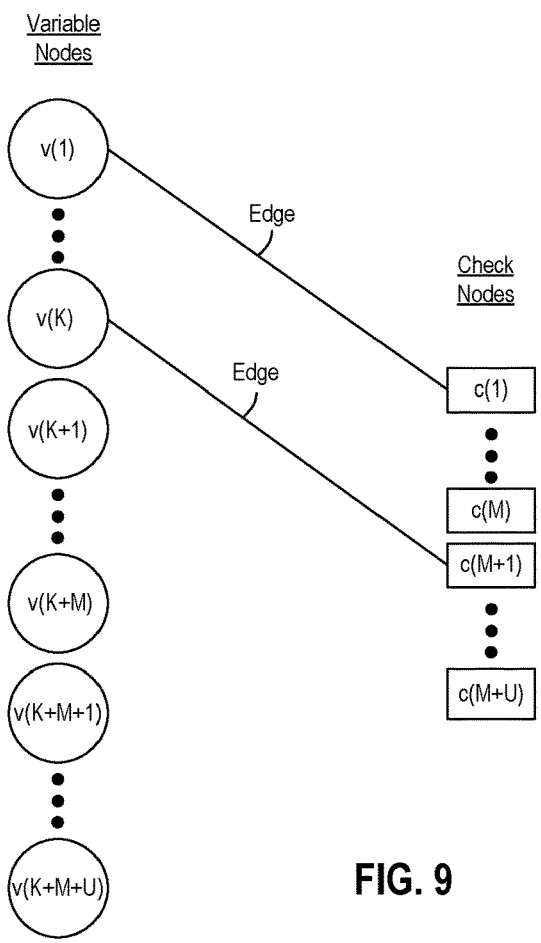
FIG. 9 is a schematic diagram of a partially completed Tanner graph corresponding to the modified parity-check matrix of FIG. 8.

FIG. 9 shows a schematic diagram of a partially completed Tanner graph corresponding to the modified parity-check matrix H' of FIG. 8. In general, a Tanner graph may include variable nodes (or just variables), check nodes (or just checks), and edges connecting the check nodes and the variables nodes. The number of variable nodes may be equal to the number of columns in the modified parity-check graph H' and the number of bits in a codeword. Accordingly, there may be a K-number variables v(1) to v(K) corresponding to the K-number of information bits and K columns, an M-number of variables v(K+1) to v(K+M) corresponding to the M-number of first-type parity bits and M columns, and a U-number of variables v(K+M+1) to v(K+M+U) corresponding to the U-number of second-type parity bits and U columns. The number or check nodes may be equal to the number of rows in the modified parity-check graph H' and the M+U number of parity bits in the codeword. Accordingly, there may be a M-number of first checks c(1) to c(M) that are connected to variables corresponding to the information bits and/or first-type parity bits only (i.e., none of the checks c(1) to c(M) are connected to any variable corresponding to a second-type parity bit), and a U-number of second checks c(M+1) to c(M+U), each of which may be connected to one or more variables corresponding to one or more information bits, one or more variables corresponding to one or more first-type parity bits, one or more variables corresponding to one or more second-type parity bits, or a combination thereof. As used herein, and unless otherwise specified, an "M check node" (or just M check) refers to one of the M-number of first check nodes c(1) to c(M), and a "U check node" (or just U check) refers to one of the U-number of second checks c(M+1) to c(M+U).

A particular variable node may be connected to a particular check node via an edge if the element corresponding to that variable node and that check node has a 1 value instead of a 0 value in the modified parity-check matrix H'. For example, FIG. 9 shows an edge connecting the first variable node v(1) and the first check node c(1). This indicates that the element in the first row and the first column of the modified parity-check matrix H' has a 1 value.

When decoding a codeword read from the memory dies 104, the values of the variables may be set to the values of the corresponding bits of the codeword. A codeword is considered free of errors (i.e., all of its bit values are correct) if for each of the check nodes, the XOR (or modulo 2 sum) of all of the variables connected a check node (also referred to as a syndrome bit) is equal to zero. This means that the constraints defined by the parity bits and the check nodes are satisfied. If not, then the decoding process may involve flipping the bit values (i.e., changing a bit value of 1 to 0 or vice versa) of one or more bits in the codeword until the constraints are satisfied, (i.e., the XOR operations for all of the check nodes are equal to zero).

Figures 10, 11:
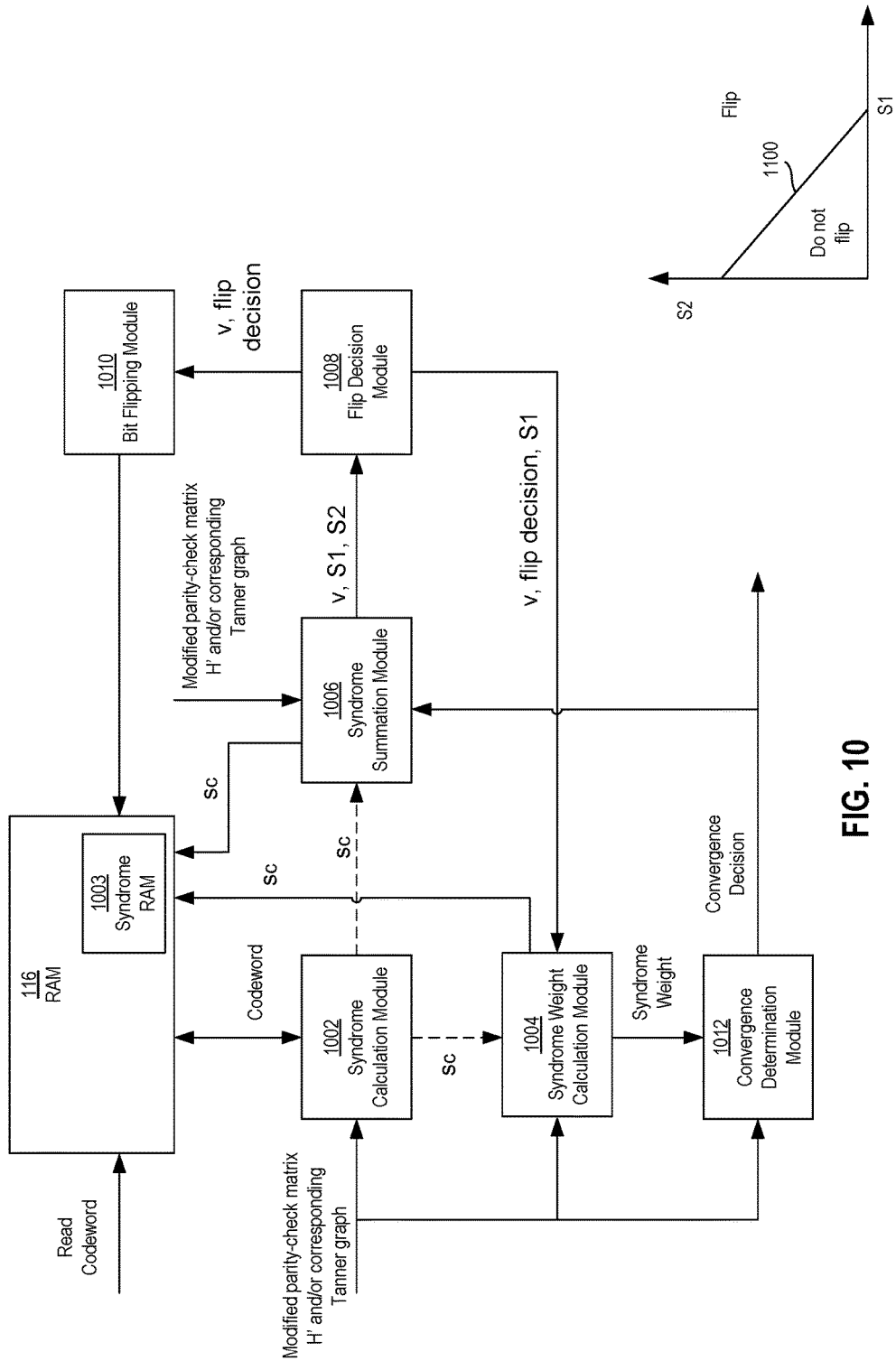
FIG. 10 is a block diagram of components involved in a decoding process of a read operation to read data encoded with the modified parity-check matrix of FIG. 8.
FIG. 11 is a plot of an example threshold curve generated for first and second syndrome summation values.

FIG. 10 shows a block diagram of components of the controller 102 that may be involved in a decoding process of a read operation to read data encoded with the modified parity-check matrix H' of FIG. 8 from a non-volatile memory die 104. For some example configurations, the components other than the RAM 116 may be components of the ECC engine 124, although in other example configurations, some or all of these components may be considered components separate from the ECC engine 124. In addition to the RAM 116, the components involved in the decoding process may include a syndrome calculation module 1002, syndrome RAM 1003, a syndrome weight calculation module 1004, a syndrome summation module 1006, a flip decision module 1008, a bit flipping module 1010, and a convergence determination module 1012.

When a codeword is read, it may be loaded into the RAM 116. To begin the decoding process, the syndrome calculation module 1002 may access the codeword as well as information associated with the modified parity-check matrix and/or the corresponding Tanner graph used to encode the codeword. The syndrome calculation module may calculate a syndrome value $s_c$ for each check node c according to the following equation:

$$s_c \leftarrow \sum_{v \in N(c)} b_v \bmod 2, \quad (3)$$

where $s_c$ denotes the syndrome value for a given check node c, the term $v \in N(c)$ denotes all of the variables v that are neighboring (i.e., connected to) to the given check node c, $b_v$ denotes the bit values of the variables v, and mod 2 denotes that the summation is a modulo 2 summation (or an XOR calculation).

Upon calculating the syndrome values $s_c$, the syndrome calculation module 1002 may write the syndrome values $s_c$ to the syndrome RAM 1003. FIG. 10 shows the syndrome RAM as being part of the RAM 116, although in other example configurations, the syndrome RAM 1003 may be a component that is separate from the RAM 116. For example, while the RAM 116 may be a component separate from the ECC engine 124, the syndrome RAM 1003 may be a component of the ECC engine 124.

When the syndrome values $s_c$ are initially calculated, the syndrome weight calculation module 1004 may retrieve the syndrome values $s_c$ from the syndrome RAM 1003 (or the syndrome calculation module 1002 may otherwise provide the syndrome values $s_c$ for all of the check nodes (or at least for all of the M check nodes) to the syndrome weight calculation module 1004), and use those values to calculate an initial syndrome weight value W for the codeword according to the following equation:

$$W = \sum_{c \in C^1} s_c, \quad (4)$$

where W denotes the syndrome weight, c denotes a check node, $C^1$ denotes the group of all M check nodes in the codeword, and the term $c \in C^1$ denotes all check nodes belonging to the group $C^1$. Accordingly, the syndrome weight W is initially calculated to be the sum of all of the syndrome values $s_c$ corresponding to the M check nodes. Also, noted is that equation (4) calculates the syndrome weight value W without taking into account the U check nodes. This may be advantageous since the U-check nodes can be connected to variables corresponding to second-type parity stored in bad memory cells, which are unreliable and therefore the second-type parity may be unreliable when used for decoding. As shown in FIG. 10, the syndrome weight calculation module 1004 may access the modified parity-check matrix H' and/or the corresponding Tanner graph to determine which of the syndrome values $s_c$ correspond to M checks and not U checks. However, in other example configurations, the syndrome weight W may be calculated by considering all checks (i.e., by summing the syndrome values $s_c$ associated with all of the checks, both M checks and U checks.

In addition, as shown in FIG. 10, the syndrome summation module 1006 may access the syndrome RAM 1003 to retrieve the syndrome values $s_c$ (or the syndrome calculation module 1002 may otherwise provide the syndrome values $s_c$ to the syndrome summation module 1006). In response, the syndrome summation module 1006 may calculate two syndrome summation values for each variable v, a first syndrome summation value S1 corresponding to the first-type parity and a second syndrome summation value S2 corresponding to the second-type parity. The syndrome summation module 1006 may calculate the first and second syndrome summation values according to the following equations:

$$S_1 \leftarrow \sum_{c^1 \in N(v)} s_c, \quad (5)$$

$$S_2 \leftarrow \sum_{c^2 \in N(v)} s_c, \quad (6)$$

where the term $c^1 \in N(v)$ denotes for a given variable v, all of the M check nodes connected to the given variable v, and the term $c^2 \in N(v)$ denotes for a given variable v, all of the U check nodes connected to the given variable v. Accordingly, for a given variable v, the first syndrome summation value S1 may be the sum of the syndrome values $s_c$ of the M check nodes that are connected to the given variable v, and the second syndrome summation value S2 may be the sum of the syndrome values $s_c$ of the U check nodes that are connected to the given variable v.

After calculating the first and second syndrome summation values S1, S2 for a given variable v, the syndrome summation module 1006 may provide those values to the flip decision module 1008, along with an indication of the given variable v to which the syndrome summation values S1, S2 correspond. In response, the flip decision module 1008 may make a flip decision of whether to flip the bit value of the bit $b_v$ corresponding to the given variable v. The flip decision may be based on any number of criteria corresponding to the first and second summation values S1, S2. In one example configuration, the flip decision may be based on a minimum threshold value of the first syndrome summation value S1 for a given second syndrome summation value S2, or vice versa.

FIG. 11 shows a plot of a threshold curve 1100 generated for first and second syndrome summation values. The plot shows the threshold curve 1100 as generally decreasing for the second syndrome summation value S2 as the first syndrome summation value S1 increases. The plot also shows the flip decision as being "flip" for the area to the right of the threshold curve 1100 and being "do not flip" for the area to the left of the threshold curve 1100. In general, this means that the higher the first syndrome summation value S1 is the lower the second syndrome summation value S2 has to be for the flip decision module 1008 to reach the decision of "flip." Alternatively, the lower the first syndrome summation value S1 is, the higher the second syndrome summation value S2 has to be for the flip decision module 1008 to reach the decision of "flip." Relatively low values for both the first and second syndrome summation values S1, S2 may indicate to the flip decision module not to change the current bit value of the bit $b_v$ corresponding to the given variable v. When the flip decision module 1008 receives first and second syndrome summation values S1, S2 for a given variable v, the flip decision module may determine a point associated with the values S1, S2 on the plot relative to the threshold curve 1100. If the point is to the right of the curve, the flip decision module 1008 may determine that the bit value of the bit $b_v$ corresponding to the given variable v should be changed (flipped). Alternatively, if the point is to the left of the curve, the flip decision module 1008 may determine that the bit value of the bit $b_v$ should not be changed (flipped).

Other ways of making the flip decision may be possible. For example a database of all possible combinations of the first and second syndrome summation values S1, S2 with a corresponding associated flip decision may be stored in a database of the flip decision module 1008, which the flip decision module 1008 may access upon receipt of first and second syndrome values S1, S2 during the decoding process to make the flip decision. Alternatively, the database may store minimum S1 values for a given S2 value. Knowing the S2 value, the flip decision module 1008 may compare the received S1 value with the minimum S1 value in the database. If the received S1 value is greater than or equal to the minimum S1 value, the flip decision module 1008 may determine to flip the bit value of the corresponding bit by. Alternatively, if the received S1 value is less than the minimum S1 value, the flip decision module 1008 may determine to keep the bit value of the corresponding bit $b_v$ unchanged. Various other ways making the flip decision based on first and second syndrome summation values S1, S2 for a given variable v may be possible.

Referring back to FIG. 10, the flip decision module 1008 may provide its flip decision to the bit flipping module 1010. If the flip decision indicates to flip the bit value of the corresponding bit $b_v$, then the bit flipping module 1010 may access the RAM 116 and change the bit value of the corresponding bit $b_v$, such as from a 1 value to a 0 value, or from a 0 value to a 1 value. In some configurations, the ECC engine 124 may include and/or utilize its own codeword RAM for changing the bit values of the bits of a codeword. After the decoding is finished, the ECC engine 124 may load the decoded codeword from the codeword RAM into the RAM 116. For simplicity, no distinction is made in FIG. 10 between the RAM 116 and the codeword RAM that the ECC engine 124 may include and/or utilize to perform the decoding. In addition, if the flip decision indicates to flip the bit value, the bit flipping module 1010 may be configured to access the syndrome RAM 1003 and flip the syndrome values $s_c$ corresponding to the check nodes connected to the given variable v and corresponding bit $b_v$. As a result, all associated unsatisfied checks will become satisfied and vice versa.

In addition, as shown in FIG. 10, the flip decision module 1008 may provide its flip decision to the syndrome weight calculation module 1004 for an update of the syndrome weight W. The flip decision module 1008 may also provide an indication of which variable v for which it made its flip decision as well as the first syndrome summation value S1. In response, the syndrome weight calculation module 1004 may update the syndrome weight W according to the following equation:

$$W=W+Dv^1(v)-2S_1, \quad (10)$$

where $Dv^1(v)$ denotes the number of M check nodes connected to a given variable v. As shown in FIG. 10, the convergence determination module 1012 may receive the modified parity-check matrix H' and/or the corresponding Tanner graph to determine the value of $Dv^1(v)$ for a given variable v. In other example configurations where the syndrome weight W is calculated over all of the checks (not just the M checks), the syndrome weight W may be updated according to the following equation:

$$W=W+Dv(v)-2(S_1+S_2), \quad (10.1)$$

where $Dv(v)$ denotes the total number of checks (M checks and U checks) connected to a given variable v.

Upon updating the calculation of the syndrome weight W, the syndrome weight calculation module 1004 may provide the syndrome weight value W to the convergence determination module 1012. In response, the convergence determination module 1012 may determine whether convergence is achieved. As used herein convergence indicates that the codeword, in its current state, is achieved and the decoding process is finished—i.e., no more bit flipping needs to be performed. If convergence is achieved for a given codeword, that codeword may referred to as a legal codeword. If the syndrome weight W has a value of 0, then the convergence determination module 1012 may determine that convergence is achieved and the decoding process is finished. The convergence determination module 1012 may send its convergence decision to another module in the controller 102, such as to the front module 108, which may indicate that the codeword is finished being decoded and is ready to be sent back to the host. Alternatively, a non-zero value for the syndrome weight W may indicate that there are still errors in the codeword and more bit flipping should be performed.

As shown in FIG. 10, the convergence decision may be provided to the syndrome summation module 1006. If the convergence decision indicates that convergence is not achieved, then the syndrome summation module 1006 may calculate first and second syndrome summation values S1, S2 for a next variable v and the decoding process may be repeated.

In some example configurations, if the syndrome weight W has been updated for all of the variables v and convergence is not achieved, then the ECC engine 124 may determine to cycle through the variables v again for another iteration. The ECC engine 124 may be configured to perform a predetermined number of iterations of the decoding in order to try to reach convergence before identifying a decode failure. That is, if the ECC engine 124 cycles through the decoding process for all of the variables v a predetermined number of iterations and convergence is still not achieved, then the decoding components of the ECC engine 124 may signal a decode failure in order to stop the decoding and for further remedial action to be taken.

Implementing encoding and decoding into the ECC engine 124 using the modified parity-check matrix H' as described with reference to FIGS. 8-11 may not incur much added cost in terms of area of the decoder because the second-type parity is generated using XOR operations. Also, as indicated above in the decoding, particular with reference to equations (4), (5), and (10), the syndrome weight calculation may be performed without factoring the syndrome values corresponding to the U check nodes (i.e., ones that may be connected to variables corresponding to second-type parity). Also, with particular reference to FIG. 8, if the fourth submatrix 804 is generated to be an identify matrix, the bits corresponding to the elements of this fourth submatrix 804 may not need to be corrected in the decoding process. Further, decoding throughput may be improved compared to other systems that utilize only a single type of parity for given bit error rate (BER) percentages. Additionally, the memory system 100 may utilize various system thresholds associated with BER for making various memory management decisions. For example, in a folding operations (copying from an SLC block to MLC/TLC block), the controller 102 may make a write verification decision by checking the BER of one or more pages to decide whether the folding was successful and/or whether a given wordline is defective. In another example, when performing a scrub operation (data refresh), the controller 102 may check the BER for one or more pages in order to decide whether a page is to be refreshed. Utilization of the modified parity-check matrix H' for encoding and decoding may allow for the use of unreliable bits/columns while using system thresholds associated with BER that are not dependent on the number of bad storage locations (e.g., bad columns). This may allow for robust encoding and decoding solutions and relatively easy system and firmware implementation.

Figure 12:
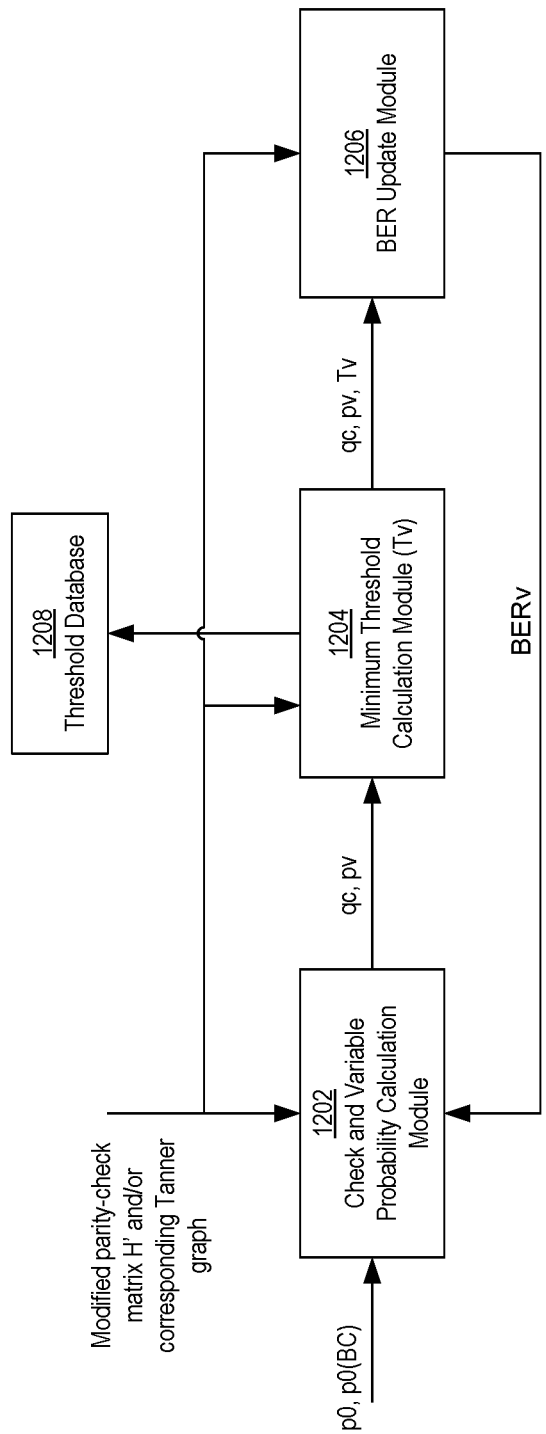
FIG. 12 is a block diagram of components involved in determining minimum thresholds where one second-type parity bit is generated.

As described, the flipping decision module 1008 may determine whether to flip the value of a bit or not based on the syndrome summation values S1, S2 relative to one or more thresholds. FIG. 12 shows a block diagram of components of the controller 102 that may be involved in determining minimum thresholds for variables v for a particular situation where one second-type parity bit is generated (i.e. U=1). The components used to determine the thresholds may include a check and variable probability calculation module 1202, a minimum threshold calculation module 1204, and a bit error rate (BER) update module 1206. For some example configurations, the modules 1202, 1204, 1206 shown in FIG. 12, may be components of the non-volatile memory system 100, such as components of the ECC engine 124 or components separate from the ECC engine 124 but still internal to the non-volatile memory system 100. For other example configurations, the components shown in FIG. 12 may be components of a computer system or device other than and/or external to the non-volatile memory system 100. For these other example configurations, the minimum threshold calculation module 1204 may calculate the first and second minimum thresholds $T_v^0$, $T_v^1$, and these minimum thresholds $T_v^0$, $T_v^1$ may be sent and stored in the non-volatile memory system 100, such as in the RAM 116 and/or the memory dies 104. In still other configurations, some of the modules 1202-1206 may be internal to the non-volatile memory system 100 while the other modules 1202-1206 may be external to the non-volatile memory system 100. Various configurations are possible. Additionally, the calculations performed by the modules 1202-1206, whether within or external to the non-volatile memory system 100, may be considered offline calculations in that they are performed external and/or prior to a decoding process performed by the non-volatile memory system 100.

In general, for a given variable v of a group of variables V associated with a codeword, the check and variable probability calculation module 1202 may generate check and variable probability values $q_c^{err}$, $q_c^{cor}$, $p_v^{err}$, $p_v^{cor}$, the minimum threshold calculation module 1204 may calculate minimum thresholds $T_v^0$, $T_v^1$ based on the probability values $q_c^{err}$, $q_c^{cor}$, $p_v^{err}$, $p_v^{cor}$, and the BER update module 1206 may then update a $BER_v$ associated with the given variable v and send the updated $BER_v$ back to the check and variable probability calculation module 1202 for calculation of a next variable v of the group of variables V. The bit error rate $BER_v$ associated with the given variable v. $BER_v$ may be the probability that a bit value associated with the given variable v is erroneous, which can be denoted as $Pr(v_{error})$. In this regard, $BER_v$ or $Pr(v_{error})$ may be an error probability of a bit associated with a given variable v. The check and variable probability calculation module 1202, the minimum threshold calculation module 1204, and the BER update module 1206 may cycle through all of the variables v of the variable group V and calculate minimum thresholds $T_v^0$, $T_v^1$ for each of the variables v. In some example methods, the modules 1202, 1204, and 1206 may cycle through the variable group V a predetermined number of iterations so that the minimum thresholds $T_v^0$, $T_v^1$ for each of the variables v are calculated a predetermined number of times. In some example configurations, the predetermined number of iterations may correspond to the maximum number of iterations that the decoding components of FIG. 10 (or other decoding components of an ECC engine) may perform the decoding before identifying a decode failure.

In further detail, the check and variable probability calculation module 1202 may calculate a pair of check probability values $q_c^{err}$, $q_c^{cor}$ and a pair of variable probability values $p_v^{err}$, $p_v^{cor}$ for each variable v of a group of variables V associated with a codeword. For a given variable v, a first check probability value $q_c^{err}$ for a given check node c connected to the given variable v may be defined as the probability that the given check node c is unsatisfied given that a bit value associated with the given variable v is erroneous, or mathematically:

$$q_c^{err} \triangleq Pr(c_{unsat.} \mid v_{error}), \qquad (11)$$

where $c_{unsat}$ denotes that the given check node c is unsatisfied (meaning that the XOR of the variables connected to it does not equal zero), and $v_{error}$ denotes that the bit value associated with the given variable v for which the first check probability value $q_c^{err}$ is being calculated is erroneous. Similarly, for a given variable v, a second check probability value $q_c^{cor}$ for a given check node c connected to the given variable v may be defined as the probability that the given check node c is unsatisfied given that a bit value associated with the given variable v is correct, or mathematically:

$$q_c^{cor} \triangleq Pr(c_{unsat.} \mid v_{correct}), \qquad (12)$$

where $v_{correct}$ denotes that the bit value associated with the variable v for which the second or check probability $q_c^{cor}$ is being calculated is correct. For a given variable v in the group of variables V, first and second check probabilities $q_c^{err}$, $q_c^{cor}$ may be calculated for each check node c connected to the given variable v.

In addition, a first variable probability variable $p_v^{err}$ for a given variable v may be defined as the probability that a sum of all unsatisfied checks (an unsatisfied check being equal to 1) connected to the given variable v except second-type parity checks, the sum being denoted by a summation variable $Z_v$, is equal to index j given that the bit value associated with the given variable v is erroneous, for all values of index j from 0 to Dv(v), where Dv(v) denotes the number of check nodes corresponding to first-type parity connected to the given variable v, as previously described. Mathematically, the first variable probability value $p_v^{err}$ may be defined as:

$$p_v^{err} = \Pr(Z_v = j | v_{error}), j = 0, 1, \ldots, Dv(v), \quad (13)$$

where the summation variable $Z_v$ may be mathematically defined as:

$$Z_v \triangleq \sum_{c' \in N(v) \backslash \hat{c}} I_{c'}, \quad (14)$$

where the variable $\hat{c}$ denotes the U check nodes, where the term $\hat{c} \in N(v) \backslash \hat{c}$ denotes all of the check nodes c' connected to (neighboring) the given variable v except the U check nodes $\hat{c}$, and where, for a given check node c', an associated indication variable $I_{c'}$ is set to 1 if the given check node c' is unsatisfied, and set to 0 if the given check node c' is satisfied. Mathematically, the indication variable $I_{c'}$ may be represented as:

$$I_{c'} \triangleq \begin{cases} 1, & \text{check } c' \text{ is unsatisfied} \\ 0, & \text{check } c' \text{ is satisfied} \end{cases}. \quad (15)$$

Similarly, the second variable probability value $p_v^{cor}$ for a given variable v may be defined as the probability that a sum of all unsatisfied checks connected to the given variable v except second-type parity checks is equal to the index j given that the bit value associated with the given that the bit value associated with the given variable v is correct. Mathematically, the second variable probability value $p_v^{cor}$ may be defined as:

$$p_v^{cor} \Pr(Z_v = j | v_{correct}), j = 0, 1, \ldots, Dv(v). \quad (16)$$

The check probability values $q_c^{err}$ and $q_c^{cor}$ may be calculated based on BER values associated with the variables. Initially (e.g., before BERs are updated by the BER update module 1206), the BERs associated with variables stored in good memory cells may be set to a default or predetermined BER value $p_0$, which may be a default or predetermined channel BER value for bits stored in good memory cells, and BERs associated with variables stored in bad memory cells may be set to a default or predetermined BER value $p_0^{BC}$, which may be a default or predetermined channel BER value for bits stored in bad memory cells. These default or predetermined BER values $p_0$ and $p_0^{BC}$ may be known or assumed values associated with BER ranges based on characteristics of the channels between the controller 102 and the memory dies 104, or alternatively may be measured online.

For a given variable v, the check and variable probability calculation module 1202 may calculate a pair of first and second check probability values $q_c^{err}$, $q_c^{cor}$ for each check node c that is connected to the given variable v. So, if three check nodes are connected to the cor given variable v, then three pairs of first and second check probability values $q_c^{err}$, $q_c^{cor}$, corresponding to those three check nodes may be calculated. For a given variable v and a given check node c, the check and variable probability calculation module 1202 may calculate a pair of first and second check probability values $q_c^{err}$, $q_c^{cor}$ according to the following equations:

$$q_c^{err} \leftarrow 1/2 \left( 1 + \prod_{v' \in N(c) \backslash v} [1 - 2BER_{v'}] \right), \quad (17)$$

$$q_c^{cor} \leftarrow 1/2 \left( 1 + \prod_{v' \in N(c) \backslash v} [1 - 2BER_{v'}] \right), \quad (18)$$

where the term $v' \in N(c) \backslash v$ denotes all variables connected to the given check node c except the given variable v.

After the check and variable probability calculation module 1202 calculates the first and second variable probability values $q_c^{err}$, $q_c^{cor}$ for a given variable v, it then calculates pairs of first and second variable probability values $p_v^{err}$, $p_v^{cor}$ for the given variable v using the first and second probability values $q_c^{err}$, $q_c^{cor}$. In particular, the first variable probability value $p_v^{err}$ as defined above in equation (13) can be calculated by convoluting probabilities of checks c' being unsatisfied and satisfied given that the bit value associated with the given variable v is erroneous over all check nodes c' that are connected to the given variable v except the U check nodes, at a position j, for all values of index j from 0 to Dv(v). Mathematically, the first variable probability value $p_c^{err}$ can be calculated according to the following equation:

$$p_v^{err} = \bigotimes_{c' \in N(v) \backslash \hat{c}} P(I_{c'} | v_{error})(j), j = 0, 1, \ldots, Dv(v), \quad (19)$$

where the term $c' \in N(v) \backslash \hat{c}$ denotes all of the check nodes c' that are connected to the given variable v except the U checks. Similarly, the second variable probability value $p_v^{cor}$ as defined above in equation (16) can be calculated by convoluting probabilities of checks c' being unsatisfied and satisfied given that the bit value associated with the given variable v is correct over all check nodes c' that are connected to the given variable v except the U check nodes, at a position j, for all values of index j from 0 to Dv(v). Mathematically, the second variable probability value $p_v^{cor}$ can be calculated according to the following equation:

$$p_v^{cor} = \bigotimes_{c' \in N(v) \backslash \hat{c}} P(I_{c'} | v_{correct})(j), j = 0, 1, \ldots, Dv(v). \quad (20)$$

Additionally, the probabilities that a given check node c is unsatisfied ($I_c = 1$) and satisfied ($I_c = 0$) given that the bit value associated with the given variable v are erroneous or correct can be calculated based on the first and second check probability values $q_c^{err}$, $q_c^{cor}$ in the form of two-element vectors. In particular, the probabilities that a given check node c is unsatisfied and satisfied given that the bit value associated with the given variable v is erroneous can be calculated according to the following equation:

$$P(I_c | v_{error}) = [1 - q_c^{err} q_c^{err}]. \quad (21)$$

In addition, the probabilities that a given check node c is unsatisfied and satisfied given that the bit value associated with the given variable v is correct can be calculated according to the following equation:

$$P(I_c | v_{correct}) = [1 - q_c^{cor} q_c^{cor}]. \quad (22)$$

The check and variable probability calculation module 1202 may generate the two-element vectors as depicted in equations (21) and (22) and substitute them in to the convolution equations of equations (19) and (20), respectively, to generate the first and second variable probability values $p_v^{err}$ and $p_v^{cor}$ for each index j from j=0 to Dv(v).

After the check and variable probability calculation module 1202 calculates, for a given variable v, the first and second check probability values $q_{\hat{c}}^{err}$, $q_{\hat{c}}^{cor}$ for all checks connected to the given variable v, and first and second variable probability values $p_v^{err}$, $p_v^{cor}$, it may send the probability values to the minimum threshold calculation module 1204. Based on the probability values, the minimum threshold calculation module 1204 may determine, for the given variable v, a first minimum number of M checks to be unsatisfied in order for the flip decision module 1008 to determine to change the bit value associated with the given variable v, provided that the U check ĉ is satisfied, denoted as threshold $T_v^0$, and a second minimum number of M checks to be unsatisfied in order for the flip decision module 1008 to determine to change the bit value associated with the given variable v, provided that the U check ĉ is unsatisfied. The first minimum number is denoted at minimum threshold $T_v^0$, where the superscript 0 indicates that the U check ĉ is satisfied, and the second minimum number is denoted as minimum threshold $T_v$% where the superscript 1 indicates that the U check ĉ is unsatisfied. The minimum threshold calculation module 1204 may calculate the first and second minimum thresholds for a given variable v according to the following equation and criterion:

$$T_v^y = \min_{z=0,\dots,Dv} z, \quad y = 0, 1 \qquad (23)$$

such that: $Pr(v_{error} | Z_v = z, Y = y) > Pr(v_{correct} | Z_v = z, Y = y)$ where Y is equal to 1 if the U check ĉ is unsatisfied and Y is equal to 0 if the U check ĉ is satisfied. In other words, the minimum threshold calculation module 1204 sets the first minimum threshold $T_v^0$ to the minimum value of z, for z=0, . . . , Dv where the following criterion is true: the probability of the associated bit value being erroneous given that the sum of the unsatisfied checks connected to the given variable v excluding the U check ĉ is equal to z and that the U check ĉ is satisfied is greater than the probability of the associated bit value being correct given that the sum of the unsatisfied checks connected to the given variable v excluding the U check ĉ is equal to z and that the U check is satisfied. Similarly, the minimum threshold calculation module 1204 sets the second minimum threshold $T_v^1$ to the minimum value of z, for z=0, . . . , Dv where the following criterion is true: the probability of the associated bit value being erroneous given that the sum of the unsatisfied checks connected to the given variable v excluding the U check ĉ is equal to z and that the U check ĉ is unsatisfied is greater than the probability of the associated bit value being correct given that the sum of the unsatisfied checks connected to the given variable v excluding the U check c is equal to z and that the U check ĉ is unsatisfied.

Applying Bayes's theorem and assuming that the values of $Z_v$ and Y are uncorrelated, the criterion may be modified to be based on the $BER_v$, the first and second check probability values $q_{\hat{c}}^{err}$, $q_{\hat{c}}^{cor}$ associated with the U check ĉ, and the first and second variable probability values $p_v^{err}(z)$, $p_v^{cor}(z)$ as functions of z according to the following equations:

$$Pr(v_{error}|Z_v,Y) > Pr(v_{correct}|Z_v,Y) \qquad (24)$$

$$\Leftrightarrow Pr(v_{error})Pr(Z_v,Y|v_{error}) > Pr(v_{correct})Pr(Z_v,Y|v_{correct}) \qquad (25)$$

$$\Leftrightarrow Pr(v_{error})Pr(Z_v,Y|v_{error})Pr(Y|v_{error}) > Pr(v_{correct})Pr(Z_v|v_{correct})Pr(Y|v_{correct}) \qquad (26)$$

$$\Leftrightarrow BER_v p_v^{err}(z) q_{\hat{c}}^{err} > (1-BER_v) p_v^{cor}(z) q_{\hat{c}}^{cor}, y=1 \qquad (27)$$

$$\Leftrightarrow BER_v p_v^{err}(z)(1-q_{\hat{c}}^{err}) > (1-BER_v) p_v^{cor}(z)(1-q_{\hat{c}}^{cor}), y=0. \qquad (28)$$

The minimum threshold calculation module 1204 may use equation (27) to determine the second minimum value $T_v^1$ and equation (28) to determine the first minimum value $T_v^0$.

Upon determining the first and second minimum thresholds $T_v^0$, $T_v^1$, the minimum threshold calculation module 1204 may store the thresholds $T_v^0$, $T_v^1$ in a threshold database 1208. In addition, the minimum threshold calculation module 1204 may send the thresholds $T_v^0$, $T_v^1$ along with the check probability values $q_{\hat{c}}^{err}$, $q_{\hat{c}}^{cor}$ and the second variable probability values $p_{\hat{c}}^{err}$, $p_{\hat{c}}^{cor}$ for the given variable v to the BER update module 1206.

In response, the BER update module 1206 may update the $BER_v$ associated with the given variable v. To do so, the BER update module 1206 may calculate a first flip probability defined as the probability of the bit value associated with the variable v being flipped (flip v) given that the associated bit value is erroneous, mathematically defined as:

$$p_{flip}^{err} \triangleq Pr(\text{flip } v | v_{error}), \qquad (29)$$

and a second flip probability defined as the probability of the bit value associated with the variable v being flipped given that the associated bit value is correct, mathematically defined as:

$$p_{flip}^{cor} \triangleq Pr(\text{flip } v | v_{correct}). \qquad (30)$$

The first and second flip probabilities may be calculated according to the following equations:

$$p_{flip}^{err} = q_{\hat{c}}^{err} Pr(Z_v > T_v^1 | v_{error}) + (1 - q_{\hat{c}}^{err}) Pr(Z_v > T_v^0 | v_{error}) \qquad (31)$$

$$= q_{\hat{c}}^{err} \sum_{j=T_v^1+1}^{Dv} p_v^{err}(j) + (1 - q_{\hat{c}}^{err}) \sum_{j=T_v^0+1}^{Dv} p_v^{err}(j). \qquad (32)$$

$$p_{flip}^{cor} = q_{\hat{c}}^{cor} Pr(Z_v > T_v^1 | v_{correct}) + (1 - q_{\hat{c}}^{cor}) Pr(Z_v > T_v^0 | v_{correct}) \qquad (33)$$

$$= q_{\hat{c}}^{cor} \sum_{j=T_v^1+1}^{Dv} p_v^{cor}(j) + (1 - q_{\hat{c}}^{cor}) \sum_{j=T_v^0+1}^{Dv} p_v^{cor}(j). \qquad (34)$$

After the first and second flip probabilities are calculated, they may be used to update the $BER_v$ value associated with the given variable v according to the following equation:

$$BER_v \leftarrow BER_v(1-p_{flip}^{err}) + (1-BER_v)p_{flip}^{cor}. \qquad (35)$$

After BER update module 1206 updates the $BER_v$ value associated with the given variable v, it may send the updated $BER_v$ value back to the check and variable probability calculation module for subsequent calculations of first and second check probability values $q_c^{err}$, $q_c^{cor}$ and first and second variable probability values $p_c^{err}$, $p_c^{cor}$ for a next given variable v.

The components of FIG. 12 may be configured to calculate the first and second minimum thresholds $T_v^0$, $T_v^1$ for the variables v offline or outside of the decoding process performed by the components of FIG. 10. Subsequently, when a codeword is to be decoded, such as in response to a host read command, the flip decision module 1008 (assuming that the codeword includes a single second-type parity bit) may access the threshold database 1208 for a given variable v and a given iteration to determine whether to flip the bit value of the bit associated with the given variable v.

Figure 13:
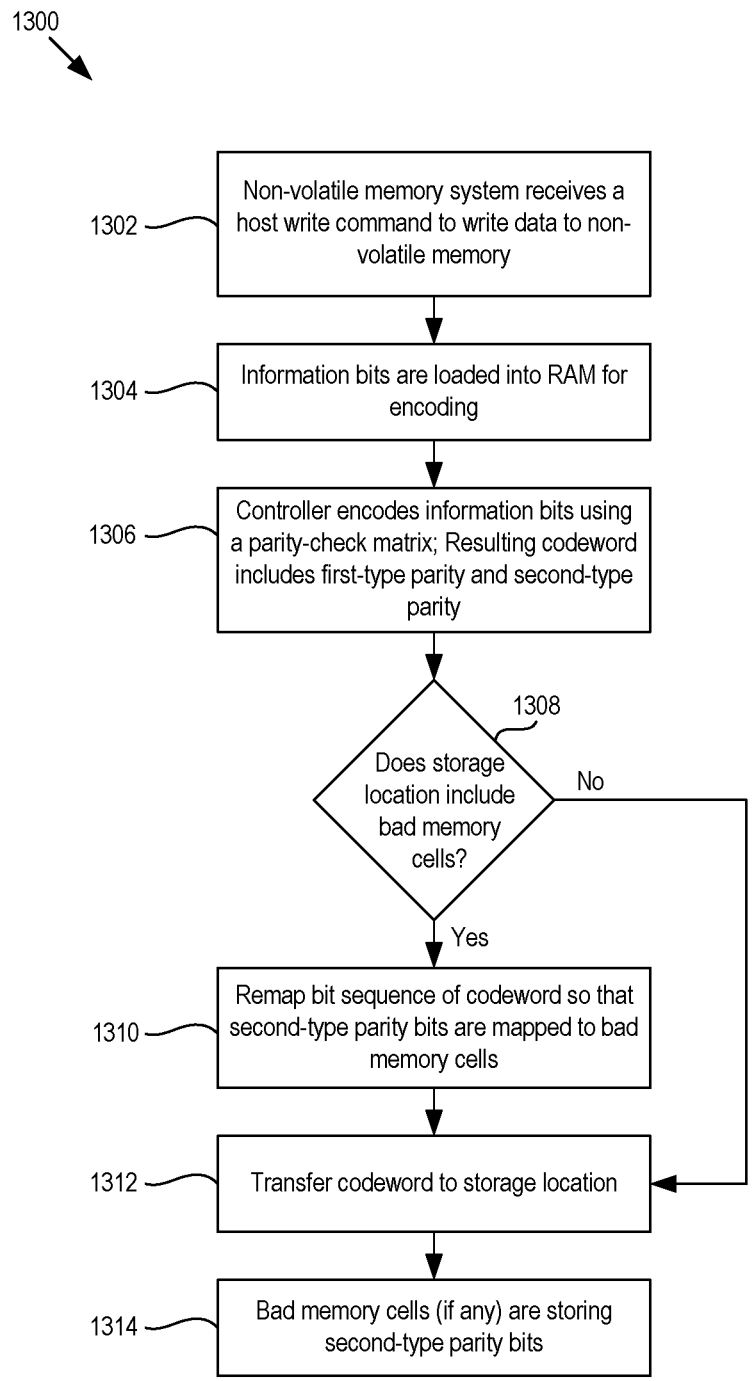
FIG. 13 is a flow chart of an example method of storing a codeword in a storage location.

FIG. 13 shows a flow chart of an example method 1300 of storing a codeword in a storage location of non-volatile memory of a non-volatile memory system. At block 1302, a host write command may be received from a host system by the non-volatile memory system to write data into the non-volatile memory. At block 1304, a set of information bits, which may include the host data and, at least in some cases header data, may be loaded into RAM for encoding. At block 1306, a controller, such as an ECC engine portion of the controller, of the non-volatile memory system may access the information bits in the RAM and apply a parity-check matrix to the information bits to encode the information bits and generate the codeword. The codeword may include first-type parity and second-type parity. In some example methods, the encoding may include encoding each of a plurality of information bit portions to generate sub-codewords, with each sub-codeword including a respective information bit portion and a sub-code parity bit portion, and joint parity bits. The sub-code parity bits may be the first-type parity and the joint parity bits may be the second-type parity. In other example methods, encoding may include encoding the information with a modified parity-check matrix as previously described with reference to FIGS. 8 and 9.

At block 1308, the controller may determine if the storage location in which the codeword is to be stored includes any bad memory cells, and if so, where those bad memory cells are located. The controller may do so by accessing a bad storage location database that identifies the bad storage locations of the non-volatile memory. At block 1310, if the codeword is to be stored in a storage location that has bad memory cells, then the controller may re-map the bit sequence of the codeword so that second-type parity bits are mapped to bad memory cells. At block 1312, after the remapping, the mapped codeword may be transferred from the RAM to the non-volatile memory for storage in the memory location. At block 1314, upon being stored, the bad memory cells of the storage location are storing second-type parity and not information bits or first-type parity. Referring back to block 1308, if the controller determines that the storage location does not include any bad memory cells, then the re-mapping may be skipped and the method may proceed directly to block 1312 for transferring of the codeword to the storage location.

Figure 14:
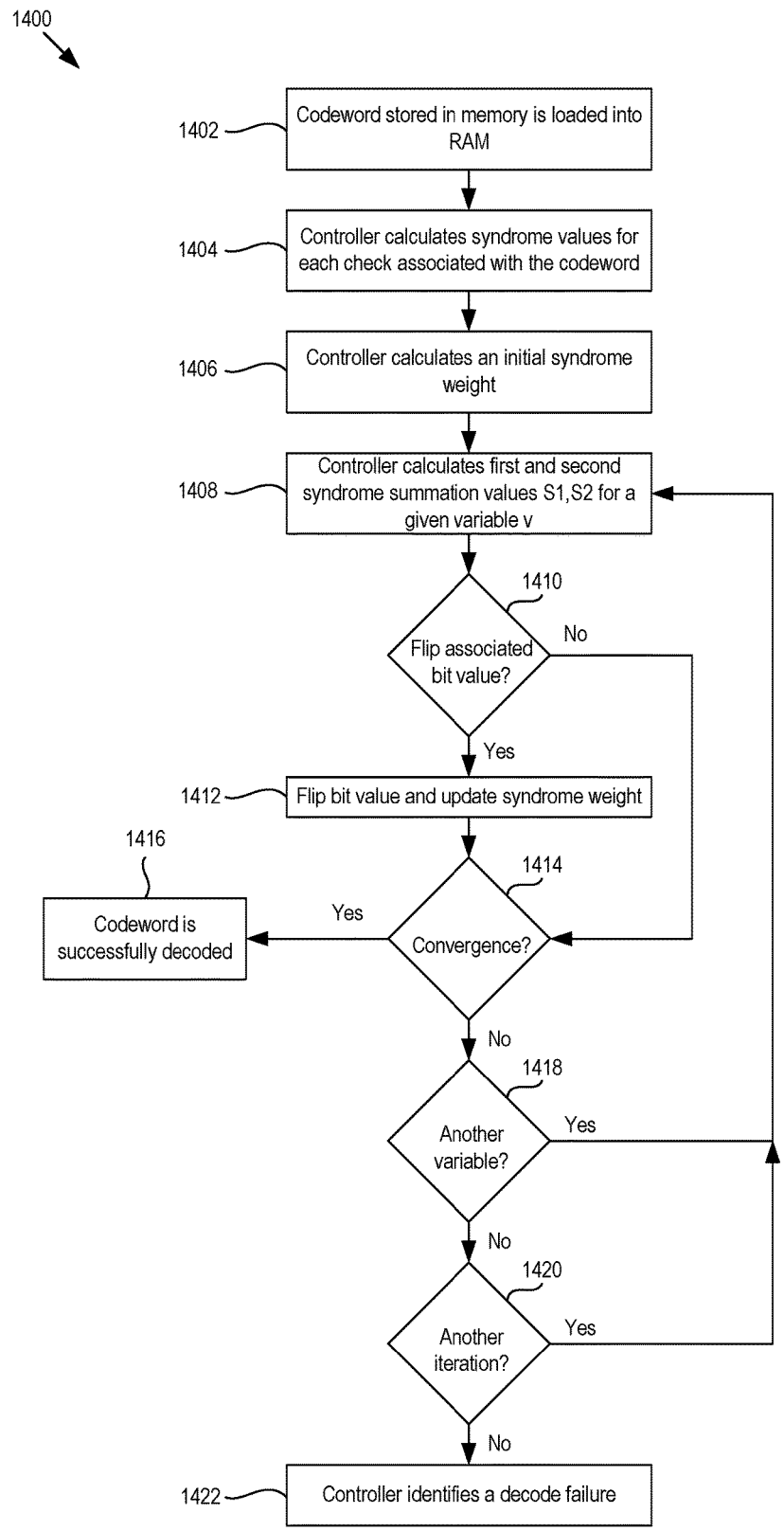
FIG. 14 is a flow chart of an example method of decoding a codeword.

FIG. 14 shows a flow chart of an example method 1400 of decoding a codeword read from non-volatile memory of a non-volatile memory system. At block 1402, the codeword may be loaded into a RAM of the non-volatile memory system. At block 1404, a controller, such as an ECC engine of the controller, may calculate a syndrome value for each check node associated with the codeword, such as according to equation (3) above. At block 1406, the controller may calculate an initial syndrome weight associated with the syndrome values, such as according to equation (4) above.

At block 1408, the controller may calculate, for a given variable v of a group of variables associated with the codeword, a first syndrome summation value corresponding to first-type parity of the codeword and a second syndrome summation value corresponding to second-type parity of the codeword, such as according to equations (5) and (6) above. At block 1410, the controller may determine whether to flip a bit value associated with the given variable v based on the first and second syndrome summation values calculated at block 1408. As previously described, the determination may be based on any number of various criteria, such as minimum threshold curve corresponding to threshold first and second syndrome summation values, or a minimum first syndrome summation value corresponding to the first-type parity given a second syndrome summation value, as non-limiting examples.

At block 1412, if the controller determines to flip the bit value of the associated bit, then the controller may flip the bit value of the associated bit. The controller may also flip the syndrome values associated with checks connected to the given variable v. In addition, the controller may update the syndrome weight, such as according to equation (10) or (10.1) above. Alternatively, if the controller determines not to flip the associated bit value, then the method may proceed directly to block 1414. At block 1414, the controller may determine whether convergence has been achieved. For some example methods, convergence may be achieved if the syndrome weight is equal to zero, as previously described.

If convergence is achieved, then at block 1416, the codeword may be considered error-free or successfully decoded, and the method may end. Alternatively, if convergence is not achieved, then at block 1418, the controller may determine whether there is another variable of the variable group within a current iteration for which to make a flip decision. If so, then the method may proceed back to block 1408, where the controller calculates first and second syndrome summation values for a next given variable v. Alternatively, if there are no more variables within the current iteration, then at block 1420, the controller may determine if it should perform another iteration of making flip decisions for the variable group, starting with an initial given variable v of the group of variables. If so, then the method may proceed back to block 1408 for another iteration of making flip decisions for the variable group. If not, then at block 1422, the controller may identify a decode failure and the decoding method may end.

Figure 15:
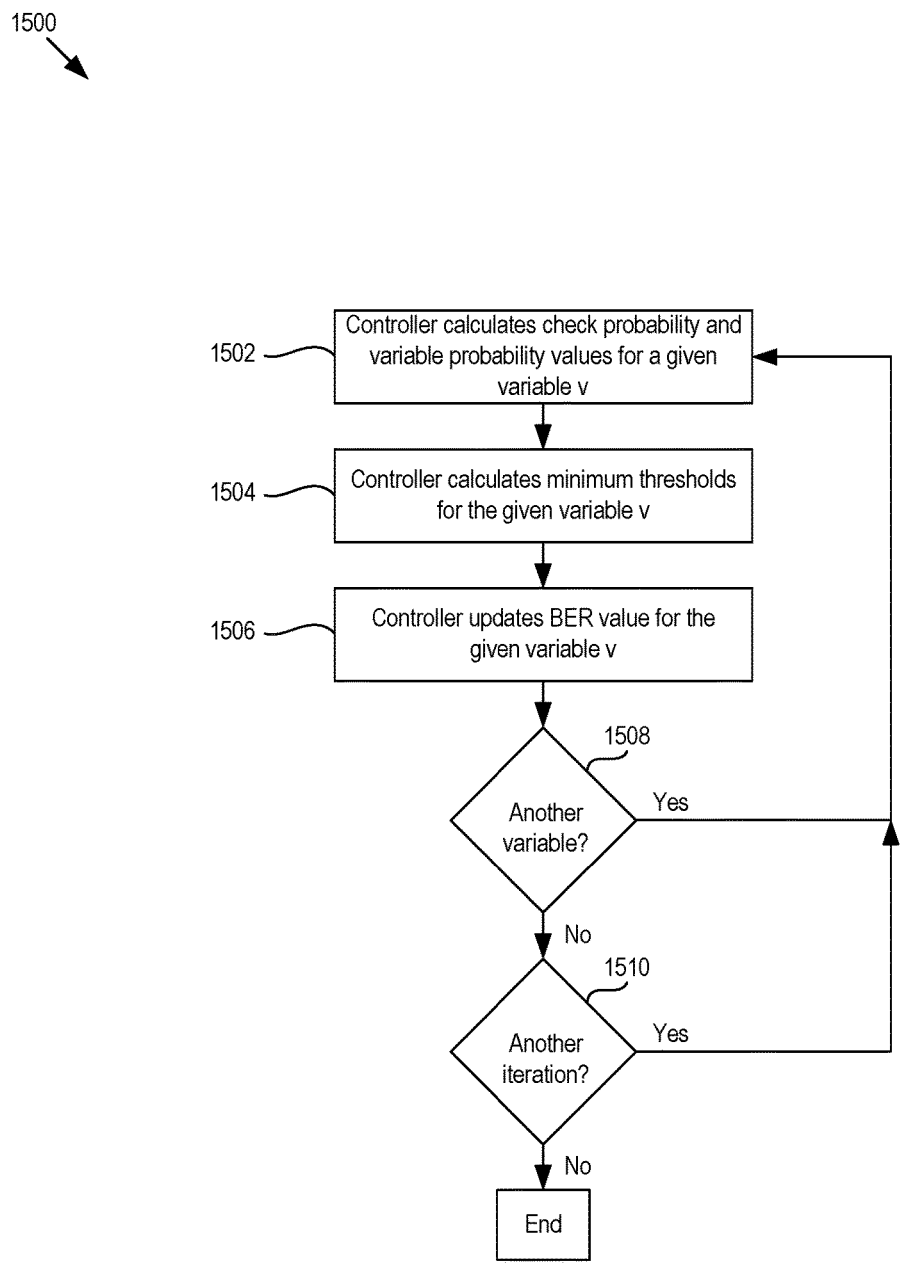
FIG. 15 is a flow chart of an example method of determining minimum thresholds for making flip decisions when decoding a codeword.

FIG. 15 is a flow chart of an example method 1500 of determining minimum thresholds for making flip decisions when decoding a codeword in a non-volatile memory system. The minimum thresholds may be determined for each of a plurality of variables, which may be part of a variable group, associated with the codeword. Also, the thresholds determined may be for a case where the codeword includes a single second-type parity bit. At block 1502, a controller of the non-volatile memory system or a computer system external to the non-volatile memory system, calculates check probability values $q_c^{err}$, $q_c^{cor}$ and variable probability values $p_v^{err}$, $p_v^{cor}$ for a given variable v associated with the codeword, such as according to equations (11)-(22) above. At block 1504, the controller may calculate, for the given variable v, a first minimum threshold $T_v^0$ when a single U check is satisfied, and a second minimum threshold $T_v^1$ when the single U check is unsatisfied, such as according to equations (23)-(28) above. At block 1506, the controller may update a bit error rate or error probability of a bit ($BER_v$) associated with the given variable, such as according to equations (29)-(35) above.

At block 1508, if there are more variables for which to calculate minimum thresholds within a current iteration, then the method may proceed back to block 1502, where the controller calculates check probability values $q_c^{err}$, $q_c^{cor}$ and variable probability values $p_v^{err}$, $p_v^{cor}$ for a next variable v, factoring in any updates to the $BER_v$ of the prior variable v calculated at block 1506. Alternatively, at block 1508, if there are no more variables for which to calculate minimum thresholds within the current iteration, then at block 1510, if there are more iterations for which to calculates minimum thresholds for the variable group, then the method may proceed back to block 1502. Otherwise, the method may end.

Lastly, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. A memory system comprising:
   memory; and
   a controller configured to:
      generate a codeword comprising a plurality of information bits, a plurality of first-type parity bits, and a second-type parity bit;
      identify a storage location of the memory in which to store the codeword, wherein the storage location comprises a bad memory cell, and wherein an information bit or a first-type parity bit is mapped to the bad memory cell;
      re-map the codeword so that the second-type parity bit is mapped to the bad memory cell; and
      store the codeword in the storage location such that the second-type parity bit is stored in the bad memory cell.

2. The memory system of claim 1, wherein the controller is configured to encode the information bits by individually encoding a plurality of portions of the information bits, wherein the plurality of first-type parity bits comprises a plurality of sub-code parity bits and the second-type parity bit comprises a joint parity bit.

3. The memory system of claim 1, wherein the controller is configured to encode the plurality of information bits with a parity-check matrix comprising a number of columns and a number of rows, each corresponding to a number of one or more second-type parity bits of the codeword comprising the second-type parity bit.

4. The memory system of claim 3, wherein elements of the parity-check matrix that are in both the number of columns and the number of rows corresponding to the number of the one or more second-type parity bits form a lower triangular submatrix of the parity-check matrix.

5. The memory system of claim 3, wherein the number of rows corresponding to the number of the one or more second-type parity bits comprises a first number of rows of the parity-check matrix, the parity-check matrix further comprising a second number of rows corresponding to the first-type parity bits, and wherein elements of the parity-check matrix that are in the number of columns corresponding to the one or more second-type parity bits and in the second number of rows corresponding to the first-type parity bits are all zeros.

6. The memory system of claim 3, wherein the number of columns and the number of rows corresponding to the number of the one or more second-type parity bits corresponds to a number of replacement columns for a page of the memory.

7. A method of storing data, the method comprising:
   determining, with a controller of a memory system, to store data in a storage location of the memory system;
   identifying, with the controller, a bad memory cell of the storage location;
   before storing a codeword associated with the data in the storage location, changing, with the controller, which bit of the codeword is to be stored in the bad memory cell; and
   storing the codeword in the storage location based on the changing.

8. The method of claim 7, wherein changing which bit comprises switching the bad memory cell from being mapped to an information bit or a first-type parity bit of the codeword to a second-type parity bit of the codeword.

9. The method of claim 7, wherein a number of second-type parity bits corresponds to a number of replacement columns associated with a page of the memory.

10. The method system of claim 7, wherein a number of second-type parity bits corresponds to a predetermined maximum number of expected bad memory cells.

11. The method of claim 7, further comprising:
    generating, with the controller, the codeword to comprise a plurality of information bits, a plurality of sub-code parity bits, and one more joint parity bits.

12. The method of claim 7, further comprising:
    encoding, with the controller, a plurality of information bits with a parity-check matrix to generate the codeword, the parity-check matrix comprising a number of columns and a number of rows, each corresponding to a number of one or more second-type parity bits of the codeword.

13. The method of claim 12, wherein elements of the parity-check matrix that are in both the number of columns and the number of rows corresponding to the one or more second-type parity bits form a lower triangular submatrix of the parity-check matrix.

14. The method of claim 12, wherein the number of rows corresponding to the number of the one or more second-type parity bits comprises a first number of rows of the parity-check matrix, the parity-check matrix further comprising a second number of rows corresponding to the first-type parity bits, and wherein elements of the parity-check matrix that are in the number of columns corresponding to the one or more second-type parity bits and in the second number of rows corresponding to the first-type parity bits are all zeros.

15. A memory system comprising:
    memory; and
    a controller configured to:
       generate a codeword comprising a plurality of information bits and a plurality of parity bits;
       determine to store the codeword in a storage location of the memory comprising a bad memory cell;
       before storing the codeword, re-map the codeword to change which bit of the codeword is stored in the bad memory cell; and
       store the codeword in the storage location according to the re-mapping.

16. The memory system of claim 15, wherein the controller is configured to switch the bad memory cell from being mapped to an information bit or a first-type parity bit of the codeword to a second-type parity bit of the codeword in order to re-map the codeword.

17. The memory system of claim 15, wherein the plurality of parity bits comprises a plurality of first-type parity bits and one or more second-type parity bits, wherein a number of the one or more second-type parity bits corresponds to a number of replacement columns associated with a page of the memory.

18. The memory system of claim 15, wherein the plurality of parity bits comprises a plurality of first-type parity bits and one or more second-type parity bits, wherein a number of the one second-type parity bits corresponds to a predetermined maximum number of expected bad memory cells.

19. The memory system of claim 15, wherein the controller is further configured to encode the plurality of information bits with a parity-check matrix to generate the codeword, the parity-check matrix comprising a number of columns and a number of rows, each corresponding to a number of one or more second-type parity bits of the codeword.

20. The method of claim 19, wherein elements of the parity-check matrix that are in both the number of columns and the number of rows corresponding to the one or more second-type parity bits form a lower triangular submatrix of the parity-check matrix.

21. The method of claim 19, wherein the number of rows corresponding to the number of the one or more second-type parity bits comprises a first number of rows of the parity-check matrix, the parity-check matrix further comprising a second number of rows corresponding to the first-type parity bits, and wherein elements of the parity-check matrix that are in the number of columns corresponding to the one or more second-type parity bits and in the second number of rows corresponding to the first-type parity bits are all zeros.

22. A memory system comprising:
a memory; and
means for generating a codeword comprising a plurality of information bits, a plurality of first-type parity bits, and a second-type parity bit;
means for identifying a storage location of the memory in which to store the codeword, wherein the storage location comprises a bad memory cell, and wherein an information bit or a first-type parity bit is mapped to the bad memory cell;
means for re-mapping the codeword so that the second-type parity bit is mapped to the bad memory cell; and
means for storing the codeword in the storage location such that the second-type parity bit is stored in the bad memory cell.

* * * * *